US006972978B1

(12) United States Patent  
Miller et al.

(10) Patent No.: US 6,972,978 B1
(45) Date of Patent: Dec. 6, 2005

(54) CONTENT ADDRESSABLE MEMORY (CAM) DEVICES WITH BLOCK SELECT AND PIPELINED VIRTUAL SECTOR LOOK-UP CONTROL AND METHODS OF OPERATING SAME

(75) Inventors: Michael Miller, Saratoga, CA (US); Bertan Tezcan, Mountain View, CA (US); Kee Park, San Jose, CA (US); Scott Yu-Fan Chu, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 62 days.

(21) Appl. No.: 10/663,860

(22) Filed: Sep. 16, 2003

Related U.S. Application Data

(63) Continuation-in-part of application No. 10/613,245, filed on Jul. 3, 2003, now Pat. No. 6,867,991, and a continuation-in-part of application No. 10/464,598, filed on Jun. 18, 2003, and a continuation-in-part of application No. 10/386,400, filed on Mar. 11, 2003, now Pat. No. 6,839,256.

(60) Provisional application No. 60/364,694, filed on Mar. 15, 2002.

(51) Int. Cl.[7] .............................................. G11C 15/00
(52) U.S. Cl. .............. 365/49; 365/189.07; 365/189.08; 365/189.12; 365/230.03; 365/230.06
(58) Field of Search .................. 365/49, 189.07, 365/189.08, 189.12, 230.03, 230.06

(56) References Cited

U.S. PATENT DOCUMENTS

| 5,386,413 A | 1/1995 | McAuley et al. |
| 5,446,685 A | 8/1995 | Holst |
| 5,497,404 A | 3/1996 | Grover et al. |
| 5,517,441 A | 5/1996 | Dietz et al. |
| 5,598,115 A | 1/1997 | Holst |
| 5,852,569 A | 12/1998 | Srinivasan et al. |
| 5,898,689 A | 4/1999 | Kumar et al. |
| 5,917,821 A | 6/1999 | Gobuyan et al. |
| 5,940,392 A | 8/1999 | Lo et al. |
| 5,940,597 A | 8/1999 | Chung |
| 6,052,683 A | 4/2000 | Irwin |
| 6,101,115 A | 8/2000 | Ross |

(Continued)

Primary Examiner—Richard Elms
Assistant Examiner—Pho M. Luu
(74) Attorney, Agent, or Firm—Myers Bigel Sibley & Sajovec PA

(57) ABSTRACT

A CAM array block is configured to perform a search operation in a staged segment-to-segment manner using a plurality of hybrid comparands that are pipelined into the CAM array block during consecutive stages of the search operation. These hybrid comparands include at least a virtual sector field and a data field. The CAM array block is also responsive to a segment address, which identifies an active segment of CAM cells in said CAM array block. The CAM array block may include a CAM array and a global mask cell sub-array that is electrically coupled to the CAM array. This global mask cell sub-array may be responsive to the segment address and a mode select signal. A bit/data line control circuit is also provided. The bit/data line control circuit is electrically coupled to the CAM array by bit lines and data lines and has inputs that are responsive to signals generated by the global mask cell sub-array. The device may also include an address translation unit that is responsive to an input address. This address translation unit may be a RAM device that receives a second portion of an input address as a read address. The RAM device may generate at least the virtual sector field and the segment address.

30 Claims, 9 Drawing Sheets

U.S. PATENT DOCUMENTS

| | | |
|---|---|---|
| 6,125,049 A | 9/2000 | Nataraj |
| 6,147,891 A | 11/2000 | Nataraj |
| 6,166,939 A | 12/2000 | Nataraj et al. |
| 6,191,969 B1 | 2/2001 | Pereira |
| 6,191,970 B1 | 2/2001 | Pereira |
| 6,236,658 B1 | 5/2001 | Essbaum et al. |
| 6,237,079 B1 | 5/2001 | Stoney |
| 6,240,001 B1 | 5/2001 | Ross |
| 6,243,280 B1 | 6/2001 | Wong et al. |
| 6,252,872 B1 | 6/2001 | Tzeng |
| 6,262,929 B1 | 7/2001 | Miyatake et al. |
| 6,324,087 B1 | 11/2001 | Pereira |
| 6,331,985 B1 | 12/2001 | Coden |
| 6,343,029 B1 | 1/2002 | Kengeri et al. |
| 6,356,951 B1 | 3/2002 | Gentry, Jr. |
| 6,370,613 B1 | 4/2002 | Diede et al. |
| 6,389,468 B1 | 5/2002 | Muller et al. |
| 6,405,247 B1 | 6/2002 | Lawande et al. |
| 6,418,442 B1 | 7/2002 | Dwyer, III |
| 6,430,074 B1 | 8/2002 | Srinivasan |
| 6,538,911 B1 | 3/2003 | Allan et al. |
| 6,542,391 B2 | 4/2003 | Pereira et al. |
| 6,584,003 B1 * | 6/2003 | Kim et al. .................... 365/49 |
| 6,657,878 B2 | 12/2003 | Lien et al. |
| 6,708,250 B2 | 3/2004 | Gillingham |
| 6,732,227 B1 * | 5/2004 | Baumann .................... 711/108 |
| 2002/0080665 A1 | 6/2002 | Hata |
| 2004/0120174 A1 | 6/2004 | Regev et al. |

* cited by examiner

CONTENT ADDRESSABLE MEMORY (CAM) DEVICES WITH BLOCK SELECT AND PIPELINED VIRTUAL SECTOR LOOK-UP CONTROL AND METHODS OF OPERATING SAME

REFERENCE TO PRIORITY APPLICATIONS

This application is a continuation-in-part of U.S. application Ser. No. 10/613,245, filed Jul. 3, 2003, now U.S. Pat. No. 6,867,991 and a continuation-in-part of U.S. application Ser. No. 10/464,598, filed Jun. 18, 2003, and a continuation-in-part of U.S. application Ser. No. 10/386,400, filed Mar. 11, 2003, now U.S. Pat. No. 6,839,256 assigned to the present assignee, the disclosures of which are hereby incorporated herein by reference.

REFERENCE TO RELATED APPLICATION

This application is related to U.S. application Ser. No. 10/386,400, filed Mar. 11, 2003, which claims the benefit of U.S. Provisional Application Ser. No. 60/364,694, filed Mar. 15, 2002.

FIELD OF THE INVENTION

The present invention relates to integrated circuit memory devices and methods of operating same, and more particularly to content addressable memory devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data is not accessed by initially supplying an address, but rather by initially applying data (e.g., search words) to the device and then performing a search operation to identify one or more entries within the CAM device that contain data equivalent to the applied data and thereby represent a "match" condition. In this manner, data is accessed according to its content rather than its address. Upon completion of the search operation, the identified location(s) containing the equivalent data is typically encoded to provide an address (e.g., CAM array block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM device to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. The '613 patent also discloses the use of CAM sub-arrays to facilitate pipelined search operations. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array block having a plurality of entries therein of logical width N, then a compare operation will yield one or more match conditions whenever all the unmasked data bits of an entry in the ternary CAM array block are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

Conventional techniques to reduce power consumption within CAM devices are disclosed in U.S. Pat. Nos. 6,191,969 and 6,191,970 to Pereira. In particular, the '969 patent discloses a CAM array having CAM cells therein that include a discharge circuit connected between each cell and a fixed ground potential. Each of the discharge circuits includes a control terminal coupled to receive a control signal indicative of the logical state of a match line segment in a respective row. These discharge circuits may be turned off to prevent discharge of respective match line segments during a search operation. U.S. Pat. No. 6,243,280 to Wong et al. also discloses a technique to selectively precharge match line segments during a search operation. However, the match line precharge circuit described in the '280 patent may suffer from relatively poor speed performance during a search operation. This poor speed performance may result whenever a wider timing margin is used in each stage of a search operation to account for worst case timing conditions. These worst case timing conditions can occur when only one CAM cell within a segment of CAM cells indicates a "miss" condition while all other CAM cells in the same segment indicate "match" conditions. Thus, in the '280 patent, the timing margin associated with each stage of a search operation should be sufficient to account for the presence of a "worst case" miss signal before a decision can be made on whether to precharge a match line segment associated with a next segment of CAM cells. U.S. Pat. No. 6,430,074 to Srinivasan discloses a precharge circuit that uses selective look-ahead match line precharging techniques. The following patents also disclose subject matter relating to match line precharging: U.S. Pat. Nos. 6,101,115; 6,125,049; 6,147,891; 6,166,939; 6,240,001; 6,262,929 and 6,343,029.

U.S. Pat. No. 5,517,441 to Dietz et al. discloses the use of inverters and pull-down transistors to pass match line signals from one match line segment to another match line segment during a search operation. U.S. Pat. Nos. 5,446,685 and 5,598,115 to Holst also disclose the use of rail-to-rail (i.e., Vdd-to-Vss) pulsed ground signals during search operations. These pulsed ground signals may facilitate selective match line discharge operations.

A conventional match line signal repeater is illustrated by FIG. 1. In particular, FIG. 1 illustrates a segmented row of CAM cells 10 that utilizes serially connected inverters I1–I4 to pass match line signals from lower match line segments to upper match line segments during a search operation. The segmented row 10 is illustrated as including three equal-length match line segments (x10 MLa, x10 MLb and x10 MLc) that are each electrically coupled to respective segments of CAM cells 12a, 12b and 12c. Prior to commencement of a search operation, a plurality of active low precharge signals (PRECHARGE1–3) are switched high-to-low in sequence during a precharge time interval. When this occurs, PMOS precharge transistors P1—P3 turn on in sequence and precharge the three match line segments to logic 1 levels (e.g., Vdd). During this precharge time interval, pairs of differential comparand data lines (not shown), which are electrically connected to the segments of CAM cells 12a, 12b and 12c, are globally masked (i.e., both the true and complementary data lines within each pair are pulled low). A search word is then applied to the data lines to commence a search operation. During the search operation, at least one match line segment is pulled low if one or more miss conditions exist in the illustrated row 10. A worst case timing scenario may exist when only the leftmost CAM cell in the row 10 (i.e., CAM cell 0) indicates a miss and all other CAM cells (i.e., CAM cells 1–29) indicate a match (often referred to as a "hit"). When this occurs, a gradual pull-down of the first match line segment x10 MLa is accelerated from left-to-right across the match line segments x10 MLb and x10 MLc, by the inverters I1–I4. Thus, the inverters I1–I4, which may be designed to have relatively strong pull-down paths, can operate to increase the pull-down speed of the match line segments and thereby improve the worst case timing characteristics when search operations are performed.

Additional power saving techniques may also be applied on a block basis by reducing the total number of CAM array blocks that participate in a given search operation. For example, CAM devices may include a plurality of CAM array blocks that may be selectively enabled and disabled so that search operations can be performed on a subset of the total number of CAM array blocks within a CAM device. U.S. Pat. No. 6,324,087 to Pereira describes a CAM device having a plurality of CAM array blocks therein. These blocks are partitioned into a plurality of individually searchable partitions, and each partition may include one or more CAM array blocks. U.S. Pat. No. 6,542,391 to Pereira et al. describes a CAM device having a plurality of CAM array blocks and a block selection circuit therein. The block selection circuit receives a class code and generates a plurality of select signals to the plurality of CAM array blocks. Each of the select signals selectively enables/disables a respective one of the CAM array blocks from participating in a search operation depending on whether the class code matches a class assignment of the CAM array block. U.S. Pat. No. 6,538,911 to Allan et al. describes a CAM device with a block select circuit that provides power management. The CAM device includes a block select bus, which is capable of selecting at least one CAM array block during search operations. FIG. 6 of the '911 patent also provides a schematic diagram showing a system for intelligently placing entries in predictable locations within the CAM.

Notwithstanding these conventional techniques to improve speed and reduce power consumption within a CAM device, there continues to be a need for additional techniques to reduce power consumption and achieve high speed operation.

SUMMARY OF THE INVENTION

Embodiments of the present invention include CAM devices that utilize advanced timing and power saving techniques to support high frequency search operations within large capacity CAM arrays. In some embodiments, segmented CAM arrays are provided with low power match line signal repeaters that support high speed pipelined search operations in an efficient manner. An exemplary match line signal repeater includes a dual-capture match line signal repeater that extends between xR and xS segments of CAM cells within a respective row, where R and S are positive integers. This repeater provides high speed operation by quickly accessing the state (match or miss) of a match line segment when a corresponding segment of CAM cells connected to the match line segment undergoes a respective stage of a pipelined search operation. If the match line segment is initially assessed as having a match signal thereon, then that match signal is passed to a next match line segment within the same row and a next stage search operation is commenced. However, if the match line segment is erroneously assessed as having a match signal thereon, when a miss condition was actually present in the corresponding segment of CAM cells, then the signal repeater will operate to capture a late miss signal and pass that late miss signal to the next higher match line segment, and thereby correct the error.

In particular, a dual-capture match line signal repeater may be configured to: (i) transfer a "early" match signal from a xR match line segment to a next higher xS match line segment during an early capture time interval; and then (ii) transfer the "late" miss signal, if present, from the xR match line segment to the xS match line segment during a late capture time interval that terminates after termination of the early capture time interval. In this manner, an early assessment of a match condition can be made in order to shorten the per-stage search cycle time. However, if the early assessment is erroneous because a worst case miss condition was actually present (resulting in a weak miss signal that is represented by a relatively gradual high-to-low transition of the match line), then the erroneous assessment is corrected and provided to the next segment of CAM cells while that next segment is undergoing the next stage of the search operation. However, because such an erroneous assessment is typically rare, the benefit of shorter search latency more than adequately compensates for the infrequent case when match line power is not conserved.

An additional embodiment of the present invention includes methods of performing pipelined search operations within a segmented CAM array. These methods may include applying a first segment of a search word to first data lines that are electrically coupled to the first segment of CAM cells during a first stage of the pipelined search operation. Then, after a relatively short evaluation time period has elapsed, an early match signal, if present, is passed from a first match line segment associated with the first segment of CAM cells to a second match line segment associated with a second segment of CAM cells. This passing of the match signal may be performed while second data lines, which are electrically coupled to the second segment of CAM cells, are globally masked. Then, during a second stage of the pipelined search operation, a second segment of the search word is applied to the second data lines and a late miss signal is simultaneously passed from the first match line segment to the second match line segment, to thereby correct for the early passing of an erroneous match signal.

Further embodiments of the present invention include an integrated circuit device having a CAM array block therein that is configured to perform a search operation in a staged segment-to-segment manner using a plurality of hybrid comparands that are pipelined into the CAM array block during consecutive stages of the search operation. These hybrid comparands include at least a virtual sector field and a data field. The CAM array block is also responsive to a segment address, which identifies an active segment of CAM cells in the CAM array block (the other inactive segments are globally masked during a respective search operation). In these embodiments, the CAM array block may include a CAM array and a global mask cell sub-array that is electrically coupled to the CAM array. This global mask cell sub-array may be responsive to the segment address and a mode select signal, which designates a width of the comparand. A bit/data line control circuit is also provided. The bit/data line control circuit is electrically coupled to the CAM array by bit lines and data lines and has inputs that are responsive to active low mask assertion signals (MASKB) generated by the global mask cell sub-array. These mask assertion signals define the locations of global masks during each search operation. These global masks may be applied to one or more columns of CAM cells, and may even be applied to an entire segment of the CAM array. The integrated circuit device may also include an address translation unit that is responsive to an input address. This address translation unit may include a RAM device that receives a second portion of an input address as a read address. The RAM device may generate at least a virtual sector address and the segment address. This virtual section address may be combined with a first portion of the input address to define the hybrid comparand (i.e., search word).

Still further embodiments of the present invention include methods of operating a CAM array by performing a search operation in a staged segment-to-segment manner across a segmented CAM array using a plurality of hybrid comparands. These hybrid comparands are pipelined into the CAM array during consecutive stages of the search operation, and each of the plurality of hybrid comparands may include at least a virtual sector field and a data field. This step of performing a search operation may include applying a virtual sector field (VSEG1) and a first data field (WORD1) of a first hybrid comparand to a first plurality of data lines that are electrically coupled to a first segment of CAM cells in the CAM array, while concurrently applying a data field (WORD2) of a second hybrid comparand to a second plurality of data lines that are electrically coupled to a second segment of CAM cells in the CAM array. Further methods of operating an integrated circuit device may also include decoding a first portion of a first input address into sector, sub-sector and virtual sector addresses and then performing a search operation in a sector of a CAM device that is designated by the sector address. This search operation includes applying a first hybrid comparand comprising the virtual sector address and a second portion of the first input address, to first data lines that are electrically coupled to a CAM array within the sector.

Additional embodiments of the present invention include an integrated circuit system that utilizes CAM operations in conjunction with a processing unit (e.g., CPU). These systems may include a multi-port memory array containing packet header data therein and funnel logic that is configured to generate an N-bit comparand, which includes portions of at least two header fields read from distinct locations in the multi-port memory array. A content addressable memory device is also provided. The CAM device is configured to generate an index in response to application of the N-bit comparand during a search operation. A memory device is also provided having entries of microcode therein. An entry is partitioned into at least a first field that identifies a write address in the multi-port memory array to which the index (or data derived from using the index as a pointer (e.g., into a RAM device)) is to be written. The funnel logic may include a multiplexer that is configured to receive read data from the multi-port memory array and a map table that is configured to pass select signals to the multiplexer, in response to a read address derived from a bit map field within the entry of microcode.

DETAILED DESCRIPTION OF PREFERRED EMBODIMENTS

Figure 1:
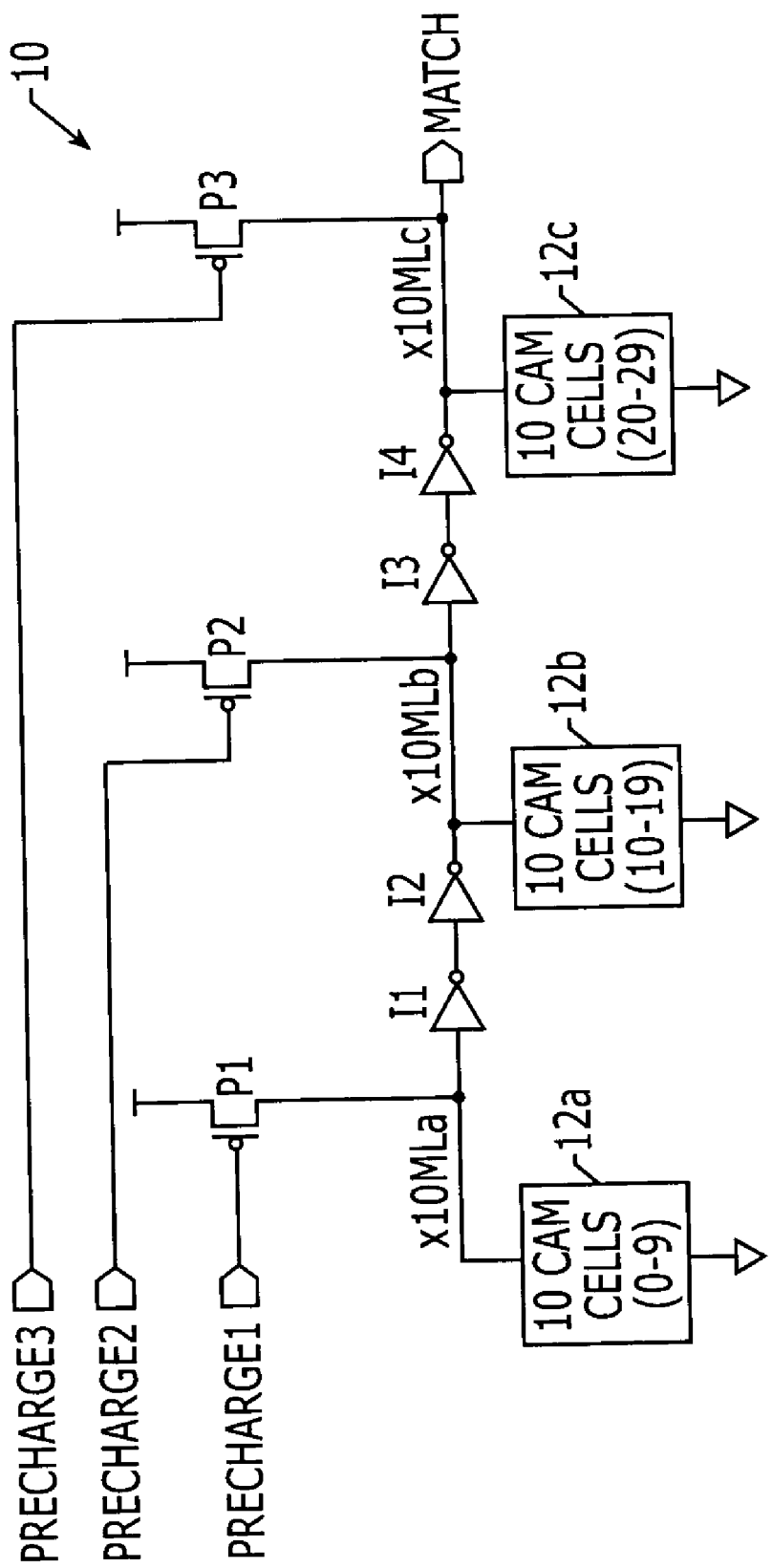
FIG. 1 is an electrical schematic of a row of CAM cells having a match line signal repeater therein, according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. Moreover, when a device or element is stated as being responsive to a signal(s), it may be directly responsive to the signal(s) or indirectly responsive to the signal(s) (e.g., responsive to another signal(s) that is derived from the signal(s)). The suffix B (or prefix symbol "/") to a signal name may also denote a complementary data or information signal or an active low control signal, for example.

Figure 2A:
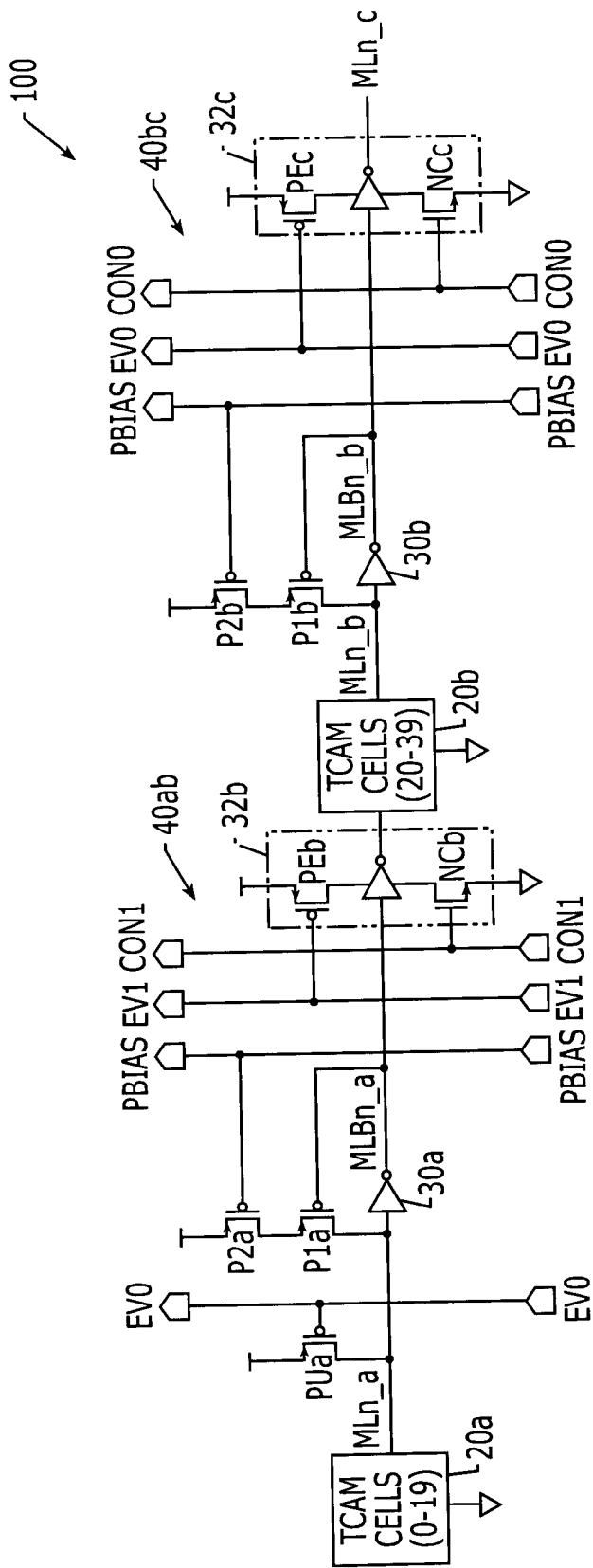
FIG. 2 is an electrical schematic of a row of CAM cells having a dual-capture match line signal repeater therein according to embodiments of the present invention. This row is divided into two halves, with FIG. 2A illustrating a left half (columns <0:39>) and FIG. 2B illustrating a right half (columns <40:79>).
Figure 2:
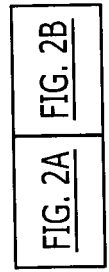
Figure 2B:
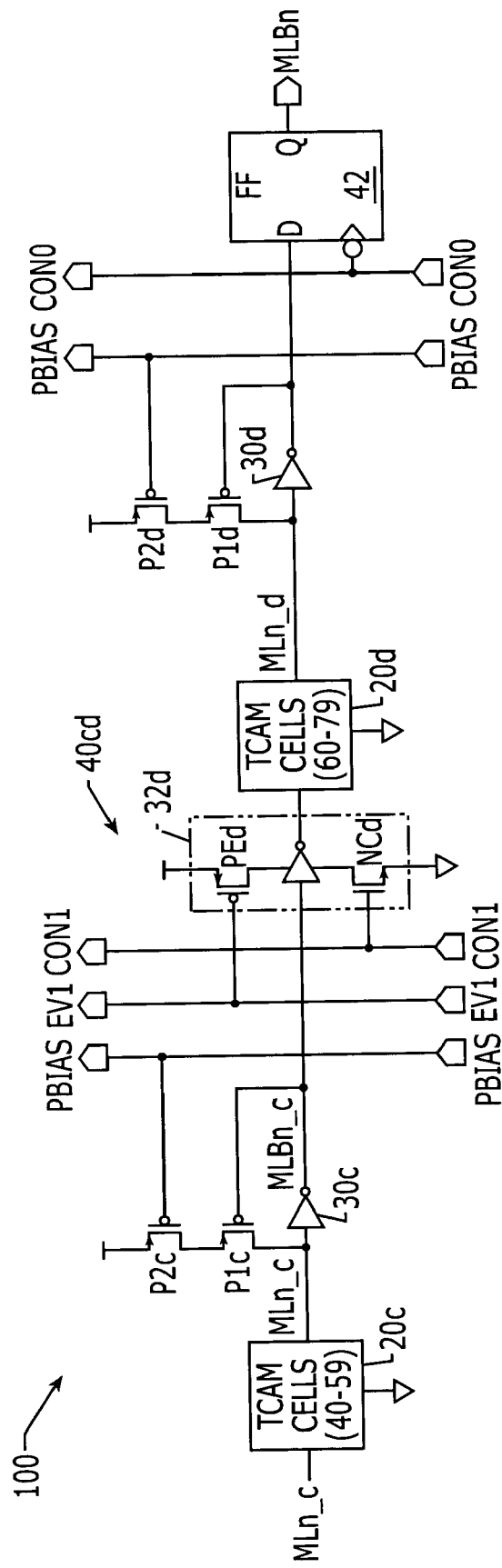
Figure 4:
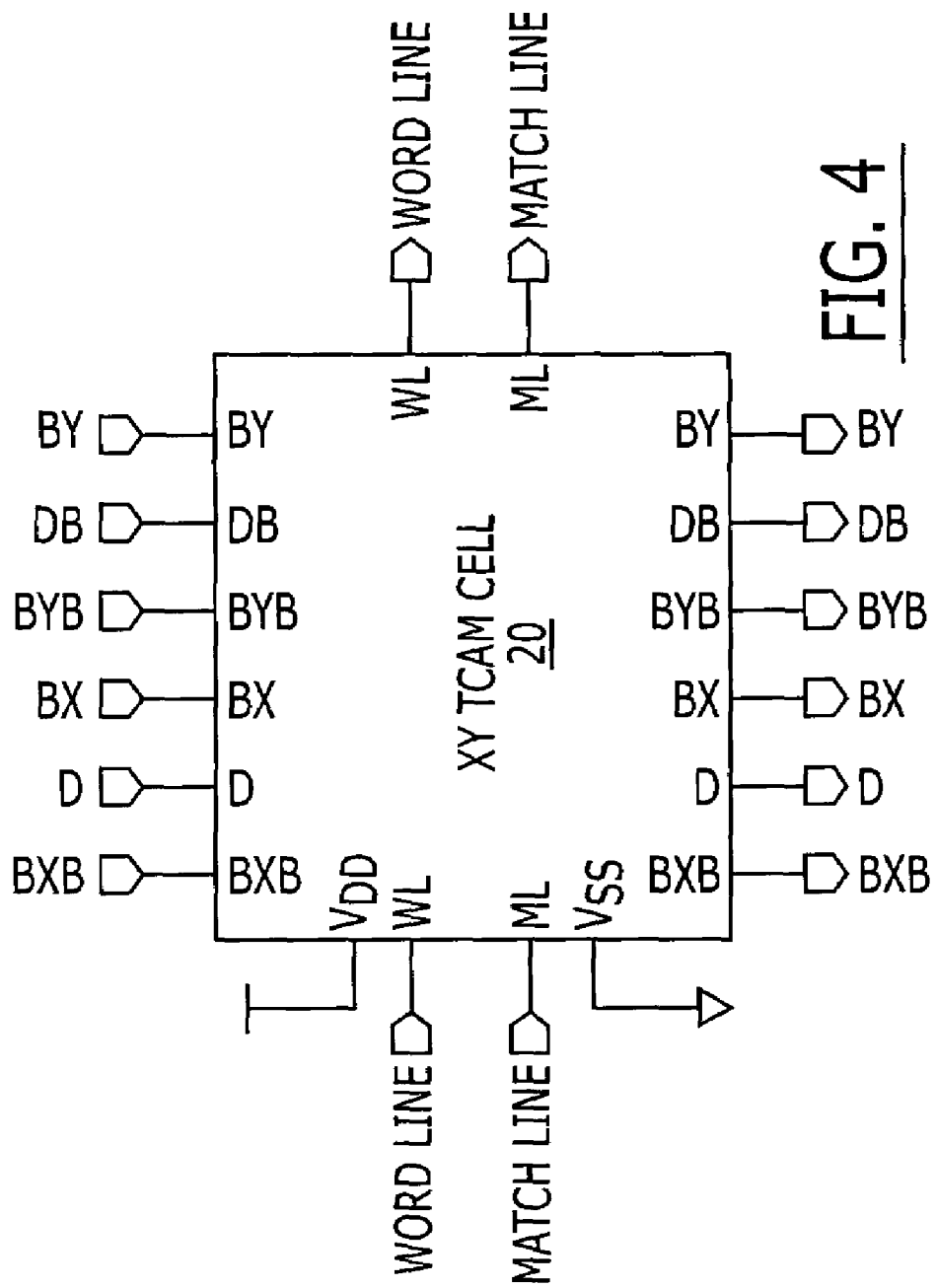
FIG. 4 is a block diagram of an XY ternary CAM (TCAM) cell that may be used in the embodiment of FIG. 2.

Referring now to FIG. 2, a content addressable memory (CAM) array having a segmented row 100 of CAM cells therein will be described. The row 100, which has been segmented into four equal width segments, is illustrated as having a logical width of 80 CAM cells, however, additional cells (not shown) may be added to one or more segments in order to provide column redundancy. Thus, in the illustrated embodiment, the segments each have a logical width of 20 CAM cells. These segments of CAM cells are described herein as a x20a segment, which spans columns 0–19, a x20b segment, which spans columns 20–39, a x20c segment, which spans columns 40–59, and a x20d segment, which spans columns 60–79. Other configurations of rows having a different number of segments and segments of unequal width are also possible (see, e.g., FIG. 6). As illustrated by FIG. 4, the CAM cells may constitute ternary CAM (TCAM) cells, however, binary and quaternary CAM cells may also be used. In particular, FIG. 4 illustrates an XY TCAM cell 20 that is connected to two pairs of bit lines ((BX, BXB) and (BY, BYB)) and one pair of data lines (D, DB). The bit lines provide write data (or read data) to (or from) the CAM array during write (or read) operations. In contrast, the data lines provide comparand data (i.e., search words) to the CAM array during search operations. The XY CAM cell 22 is also illustrated as being connected to a respective word line (WL), a respective match line (ML), a power supply line Vdd and a ground reference line Vss.

The CAM cells in FIG. 2 are grouped according to segment. The first segment of CAM cells 20a, which spans columns 0–19 of the array, is electrically connected to a first x20a match line segment (shown as MLn_a, where "n" designates the row number). The second segment of CAM cells 20b, which spans columns 20–39 of the array, is electrically connected to a second x20b match line segment (shown as MLn_b). The third segment of CAM cells 20c, which spans columns 40–59 of the array, is electrically connected to a third x20c match line segment (shown as MLn_c). Finally, the fourth segment of CAM cells 20d, which spans columns 60–79 of the array, is electrically connected to a fourth x20d match line segment (shown as MLn_d).

A dual-capture match line signal repeater is provided between each of the illustrated match line segments. In particular, a first dual-capture match line signal repeater 40ab is provided between the match line segments MLn_a and MLn_b, a second dual-capture match line signal repeater 40bc is provided between match line segments MLn_b and MLn_c, and a third dual-capture match line signal repeater 40cd is provided between match line segments MLn_c and MLn_d.

The first signal repeater 40ab is illustrated as including a first inverter 30a and a second inverter 32b. The first inverter 30a may be defined internally by one PMOS pull-up transistor and one NMOS pull-down transistor. In contrast, the second inverter 32b, which has a tri-state output, includes a pull-up path defined by two PMOS pull-up transistors and a pull-down path defined by two NMOS pull-down transistors. An input of the second inverter 32b is electrically connected to an output of the first inverter 30a by the first complementary match line segment MLBn_a. As illustrated, the uppermost PMOS pull-up transistor PEb within the second inverter 32b has a gate terminal that is responsive to a first evaluation control signal (shown as EV1). The lowermost NMOS pull-down transistor NCb within the second inverter 32b has a gate terminal that is responsive to a first connect control signal (shown as CON1).

The second signal repeater 40bc is illustrated as including a first inverter 30b and a second inverter 32c. The first inverter 30b may be defined internally by one PMOS pull-up transistor and one NMOS pull-down transistor. The second inverter 32c, which has a tri-state output, includes a pull-up path defined by two PMOS pull-up transistors and a pull-down path defined by two NMOS pull-down transistors. An input of the second inverter 32c is electrically connected to an output of the first inverter 30b by the second complementary match line segment MLBn_b. As illustrated, the uppermost PMOS pull-up transistor PEc within the second inverter 32c has a gate terminal that is responsive to a zeroth evaluation control signal (shown as EV0). The lowermost NMOS pull-down transistor NCc within the second inverter 32c has a gate terminal that is responsive to a zeroth connect control signal (shown as CON0). These evaluation and connect control signals may be generated by timing and control circuitry (not shown) that is synchronized to a clock signal (e.g., CLK2X), as illustrated by the timing diagram 50 of FIG. 3.

The third signal repeater 40cd is illustrated as including a first inverter 30c and a second inverter 32d. The first inverter 30c may be defined internally by one PMOS pull-up transistor and one NMOS pull-down transistor. The second inverter 32d, which has a tri-state output, includes a pull-up path defined by two PMOS pull-up transistors and a pull-down path defined by two NMOS pull-down transistors. As illustrated, the uppermost PMOS pull-up transistor PEd within the second inverter 32d has a gate terminal that is responsive to the first evaluation control signal (shown as EV1). The lowermost NMOS pull-down transistor NCd within the second inverter 32d has a gate terminal that is responsive to the first connect control signal (shown as CON1).

The first match line segment MLn_a is precharged to a logic 1 voltage (e.g., Vdd) just prior to commencement of a first stage of a pipelined search operation. This precharging operation is performed by PMOS pull-up transistor PUa, which is responsive to the zeroth evaluation control signal EV0. As described more fully hereinbelow with respect to the timing diagram 50 of FIG. 3 and TABLES 1 and 2, a leading edge of the zeroth evaluation control signal, which is an active low signal, will operate to commence precharge of the first match line segment MLn_a. A pair of serially connected PMOS pull-up transistors P1a and P2a are also provided to support the first match line segment MLn_a at its precharged level, by offsetting leakage current losses that may occur in the first segment of CAM cells 20a. As illustrated, a first current carrying terminal of the PMOS pull-up transistor P1a (shown as a drain terminal) is electrically connected to the first match line segment MLn_a and a gate terminal of the PMOS pull-up transistor P1a is electrically connected to an output of the first inverter 30a. The gate terminal of the PMOS pull-up transistor P2a is responsive to a bias signal (shown as PBIAS), which may be a signal having an adjustable or one time programmable (e.g., fuse programmable) dc voltage level (e.g., $0 < V_{PBIAS} < 0.5(Vdd)$). The order of the pull-up transistors P1a and P2a may be reversed. The operating characteristics of the PMOS pull-up transistors P1a and P2a are more fully described in commonly assigned U.S. application Ser. No. 10/323,236, filed Dec. 18, 2002, the disclosure of which is hereby incorporated herein by reference.

A second pair of serially connected PMOS pull-up transistors P1b and P2b are also provided to support any positive voltage on the second match line segment MLn_b, by offsetting leakage current losses that may occur in the second segment of CAM cells 20b. Similarly, a third pair of serially connected PMOS pull-up transistors P1c and P2c are provided to support any positive voltage on the third match line segment MLn_c during search operations. Finally, a fourth pair of serially connected PMOS pull-up transistors P1d and P2d are provided to support any positive voltage on the fourth match line segment MLn_d during search operations. The fourth match line segment MLn_d terminates at an input of a final inverter 30d, which passes a match/miss result to an input of a x80 capture latch 42. As illustrated, the switching of the x80 capture latch 42 is synchronized with a trailing edge of the zeroth connect control signal CON0. The capture latch 42 generates a final active low match line signal MLBn, which may be provided to a priority encoder using conventional techniques.

Figure 3:
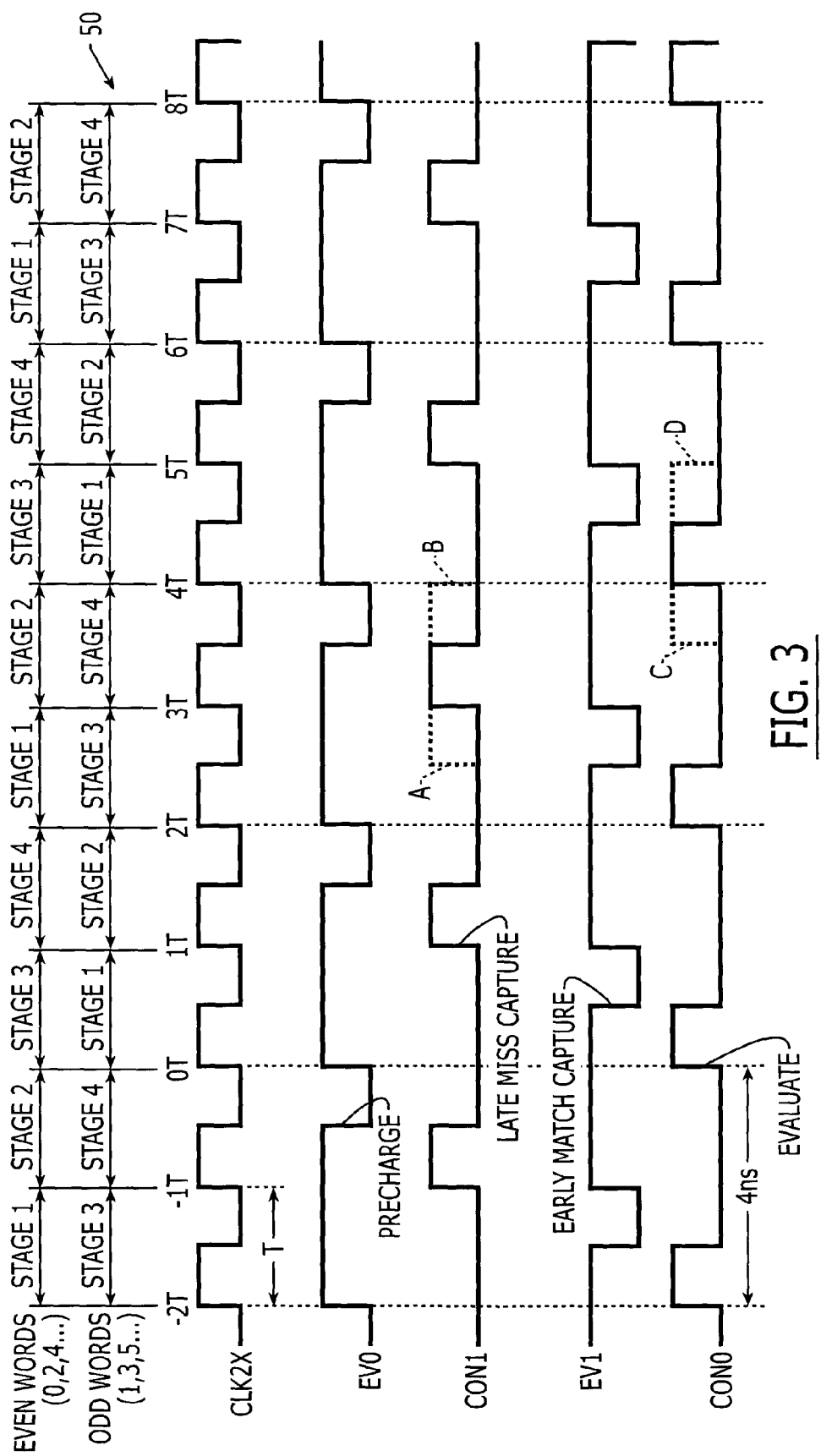
FIG. 3 is a timing diagram that illustrates the timing of control signals applied to the dual-capture match line signal repeater of FIG. 2, according to additional embodiments of the present invention.

Operations performed within the segmented row 100 of CAM cells illustrated by FIG. 2 will now be described more fully with reference to the timing diagram 50 of FIG. 3 and the search operations illustrated by TABLES 1 and 2. In particular, FIG. 3 illustrates the timing of five signals: CLK2X (a synchronizing clock signal having a period of T=2 ns), the zeroth evaluation control signal EV0, the first connect control signal CON1, the first evaluation control signal EV1 and the zeroth connect control signal CON0. As described above, the evaluation control signals EV0 and EV1 are active low signals and the connect control signals CON0 and CON1 are active high signals.

When the zeroth evaluation control signal EV0 switches high-to-low, the first match line segment MLn_a is precharged high to a logic 1 level and the PMOS pull-up transistor PEc within the second inverter 32c is turned on to enable pull-up of the third match line segment MLn_c (when the second complementary match line segment MLBn_b is maintained at a logic 0 level). When the first evaluation control signal EV1 switches high-to-low, the PMOS pull-up transistor PEb within the second inverter 32b is turned on to enable pull-up of the second match line segment MLn_b (when the first complementary match line segment MLBn_a is maintained at a logic 0 level). Switching the first evaluation control signal EV1 high-to-low also causes the PMOS pull-up transistor PEd within the second inverter 32d to turn on and enable pull-up of the fourth match line segment MLn_d (when the third complementary match line segment MLBn_c is maintained at a logic 0 level).

When the zeroth connect control signal CON0 is switched low-to-high, the NMOS pull-down transistor NCc within the second inverter 32c is turned on to enable pull-down of the third match line segment MLn_c (when the second complementary match line segment MLBn_b switches to (or is held at) a logic 1 level). When the first connect control signal CON1 is switched low-to-high, the NMOS pull-down transistor NCb within the second inverter 32b is turned on to enable pull-down of the second match line segment MLn_b (when the first complementary match line segment MLBn_a switches to (or is held at) a logic 1 level). Switching the first connect control signal CON1 low-to-high also causes the NMOS pull-down transistor NCd within the second inverter 32d to turn on and thereby enable pull-down of the fourth match line segment MLn_d (when the third complementary match line segment MLBn_c switches to (or is held at) a logic 1 level). In addition, switching the zeroth connect control signal CON0 high-to-low causes the x80 capture latch 42 to capture the signal at the output of the final inverter 30d. This captured signal is reflected as the final match line signal MLBn.

Referring specifically now to the entries within TABLES 1 and 2 and the timing diagram 50 of FIG. 3, STAGE 1 of a pipelined search operation with respect to an odd search word (e.g., WORD1) and STAGE 3 of a pipelined search operation with respect to an even search word (e.g., WORD0) occur during the time interval from 0T to 1T, which spans 2 ns. During the time interval 0T to 0.5T, bits <0:19> of WORD1 are applied to the 20 pairs of differential data lines (D/DB<0:19>) associated with the first segment of CAM cells 20a and bits <40:59> of WORD0 are simultaneously applied to the 20 pairs of differential data lines (D/DB<40:59>) associated with the third segment of CAM cells 20c. This application of data commences two side-by-side partial word search operations. Just prior to time 0T, the bit lines D/DB<0:19> and <40:59> are held low to represent a global mask condition.

When the first segment of WORD1 is applied to the data lines D/DB<0:19>, the first match line segment MLn_a will be pulled low (i.e., discharged) from a precharged high level if one or more miss conditions are present in the first segment of CAM cells 20a. A "worst" case miss condition exists from a timing standpoint when only CAM cell<0 > in the leftmost column of the CAM array detects a miss condition and all other CAM cells<1:19> detect a match condition (i.e., hit). In this case, CAM cell<0> will be solely responsible for pulling down the entire first match line segment MLn_a. Similar "worst" case miss conditions may also exist whenever only a single cell miss condition is present in one of the CAM cells<1:19>. When the third segment of WORD 0 is applied to the data lines D/DB<40: 59>, the third match line segment MLn_c will be pulled low (or held low) if one or more miss conditions are present in the third segment of CAM cells 20a.

Also during the time interval from 0T to 0.5T, the previously applied bits <20:39> of WORD0 remain on the differential data lines (D/DB<20:39>) associated with the second segment of CAM cells 20b and the previously applied bits <60:79> of WORD(−1) remain on the differential data lines (D/DB<60:79>) associated with the fourth segment of CAM cells 20d. In addition, because the first evaluation control signal EV1 is inactive at a logic 1 level and the first connect control signal CON1 is inactive at a logic 0 level during the time interval from 0T to 0.5T, the tri-state output of second inverter 32b and the tri-state output of second inverter 32d will be disposed in high impedance states. This will isolate the first match line segment MLn_a from the second match line segment MLn_b (i.e., x20a ML and x20b ML are isolated from each other) and also isolate the third match line segment MLn_c from the fourth match line segment MLn_d (i.e., x20c ML and x20d ML are isolated from each other).

Moreover, because the zeroth connect control signal CON0 switches low-to-high at time 0T, any miss signal generated on the second match line segment MLn_b (during a prior STAGE 2 of the search operation with respect to WORD0) will be captured as this miss signal passes through the second inverter 32c. In particular, if a miss is present from the prior stage, then the second complementary match line segment MLBn_b will be high and the NMOS pull-down transistor NCc associated with the second inverter 32c will be turned on in response to the low-to-high switching of the zeroth connect control signal CON0. This will cause the output of the second inverter 32c to pull (or hold) the third match line segment MLn_c segment low. In many cases, the third match line segment MLn_c segment will not need to be pulled low if it already was low during an immediately prior stage of a search operation. Thus, switching CON0 low-to-high enables the capture of a late miss signal from the second match line segment MLn_b during STAGE 3 of the search operation with respect to WORD 0. Switching the zeroth connect control signal CON0 low-to-high also operates to capture the output of the final inverter 30d, which represents a x80 match condition with respect to a prior word (WORD(−1)) that has finished a fourth stage of its search.

According to a preferred aspect of the match line signal repeaters, if a high-to-low transition of the second match line segment MLn_b is relatively gradual in response to a respective STAGE 2 of a search operation, then the low-to-high transition of the second complementary match line signal MLBn_b may also be relatively gradual, but nonetheless recognized by the second inverter 32c when the NMOS pull-down transistor NCc turns on in response to the active zeroth connect control signal CON0. As described herein, a match signal represents a logic 1 signal on a match line and a miss signal represents a logic 0 signal on a match line. In contrast, a "late" miss signal can represent either a "strong" miss signal that is captured late (relative to a match signal) or a "weak" miss signal that is captured late. A "weak" miss signal represents a logic 0 signal that was developed slowly on a match line (i.e., the high-to-low transition of the match line is not sufficiently abrupt to classify the transition as a "strong" miss signal having a sharp falling edge).

At the commencement of the time interval from 0.5T to 1T, the zeroth connect control signal CON0 switches high-to-low (at time 0.5T) to thereby turn off NMOS transistor NCc within the second inverter 32c. The first evaluation control signal EV1 also switches high-to-low to thereby turn on PMOS pull-up transistor PEb (within the second inverter 32b) and PMOS pull-up transistor PEd (within the second inverter 32d). This enables the "early" capture and passing of any logic 1 match signal from the first match line segment MLn_a to the second match line MLn_b, while data lines D/DB<20:39> are being globally masked (in preparation for STAGE 2 of the search operation with respect to WORD1). This also enables the "early" capture and passing of any logic 1 match signal from the third match line segment MLn_c to the fourth match line MLn_d, while data lines D/DB<60:79> are being globally masked (in preparation for STAGE 4 of the search operation with respect to WORD0). During this time interval from 0.5T to 1T, the second match line segment MLn_b will be isolated from the third match line segment MLn_c (because EV0=1 and CON0=0 and the output of the second inverter 32c is tri-stated), the first segment of WORD1 will remain on data lines D/DB<0:19> and the third segment of WORD0 will remain on data lines D/DB<40:59>.

STAGE 2 of a pipelined search operation with respect to search WORD1 and STAGE 4 of a pipelined search operation with respect to search WORD0 occur during the time interval from 1T to 2T. At the time point 1T, the first evaluation control signal EV1 switches low-to-high and the first connect control signal CON1 switches low-to-high. This enables a late miss signal, if any, to be passed from the first segment of CAM cells 20a to the second segment of CAM cells 20b (i.e., passed through second inverter 32b). This also enables a late miss signal, if any, to be passed from the third segment of CAM cells 20c to the fourth segment of CAM cells 20d (i.e., passed through second inverter 32d). Moreover, because the zeroth evaluation control signal EV0 and the zeroth connect control signal CON0 are held high and low, respectively, during the interval from 1T to 1.5T, the second match line segment MLn_b remains isolated from the third match line segment MLn_c.

During the STAGE 2 and STAGE 4 time intervals, bits <20:39> of WORD1 are applied to the 20 pairs of differential data lines (D/DB<10:39>) associated with the second segment of CAM cells 20b and bits <60:79> of WORD0 are simultaneously applied to the 20 pairs of differential data lines (D/DB<60:79>) associated with the fourth segment of CAM cells 20d. This application of data commences two side-by-side partial word search operations. In addition, the first segment of WORD1 (i.e., bits <0:19>) is maintained on the first segment of data lines D/DB<0:19> and the third segment of WORD0 (i.e., bits <40:59>) is maintained on the third segment of data lines D/DB<40:59>.

When the second segment of WORD1 is applied to the data lines D/DB<20:39> during STAGE 2, the second match line segment MLn_b will be pulled high-to-low (i.e., discharged) if STAGE 1 resulted in a match condition and one or more miss conditions are present in the second segment of CAM cells 20b. Alternatively, the second match line segment MLn_b will be pulled high-to-low if STAGE 1 resulted in an early capture of an erroneous match signal during the time interval 0.5T to 1T, followed by late capture of a "weak" miss signal during the time interval 1T to 1.5T. Finally, the second match line segment MLn_b will remain low during STAGE 2 if it was low at the beginning of STAGE 2 and STAGE 1 did not result in an early capture of a match signal during the time interval 0.5T to 1T.

Likewise, when the fourth segment of WORD0 is applied to the data lines D/DB<60:79> during STAGE 4, the fourth match line segment MLn_d will be pulled high-to-low (i.e., discharged) if STAGE 3 resulted in a match condition and one or more miss conditions are present in the fourth segment of CAM cells 20d. Alternatively, the fourth match line segment MLn_d will be pulled high-to-low if STAGE 3 resulted in an early capture of an erroneous match signal during the time interval 0.5T to 1T, followed by late capture of a "weak" miss signal during the time interval 1T to 1.5T. Finally, the fourth match line segment MLn_d will remain low during STAGE 4 if it was low at the beginning of STAGE 4 and STAGE 3 did not result in an early capture of a match signal during the time interval 0.5T to 1T.

Next, at the commencement of the time interval from 1.5T to 2T, the first connect control signal CON1 switches high-to-low (at time 1.5T) to thereby turn off NMOS transistor NCb within the second inverter 32b and NMOS transistor NCd within the second inverter 32d. This operates to isolate the first match line MLn_a from the second match line MLn_b and also isolate the third match line from the fourth match line MLn_d. At time 1.5T, the zeroth evaluation control signal EV0 switches high-to-low to thereby turn on PMOS pull-up transistor PUa (which precharges the first match line segment MLn_a and prepares it for STAGE 1 of a search operation) and turn on PMOS pull-up transistor PEc (within the second inverter 32c). This turn on of PMOS pull-up transistor PEc enables the "early" capture and passing of any logic 1 match signal from the second match line segment MLn_b to the third match line MLn_c, while data lines D/DB<40:59> are globally masked (in preparation for STAGE 3 of the search operation with respect to WORD1) and the second segment of WORD0 is maintained on the data lines D/DB<20:39>. The fourth segment of WORD0 is also maintained on data lines D/DB<60:79> during the time interval from 1.5T to 2T, to thereby support capture of a final match condition with respect to WORD 0 during the next time interval from 2T to 2.5T (See, e.g., TABLE 2).

STAGES 3 and 4 of the pipelined search operations with respect to WORD1 are next performed during the time intervals from 2T–3T and 3T–4T, respectively. These operations repeat the STAGE 3 operations and STAGE 4 operations described above with respect to WORD0. Moreover, during these final stage operations with respect to WORD1, STAGE 1 operations and STAGE 2 operations are performed with respect to a new word, WORD2. Accordingly, as illustrated best by the timing diagram of FIG. 3 and TABLE 2, the odd words (WORD1, WORD3, . . . ) are searched in a first repeating STAGE1–STAGE4 sequence that spans 8 ns and the even words (WORD0, WORD2, . . . ) are searched in a second repeating STAGE1–STAGE4 sequence that is time shifted relative to the first repeating sequence by a time interval of 2T (4 ns).

TABLE 1

| | |
|---|---|
| 0 T to 0.5 T<br>STAGES 1 & 3<br>(EVAL)<br>(LATE CAPTURE) | APPLY SEARCH WORD1<0:19><br>DISCHARGE x20A ML if x20A MISS<br>MAINTAIN SEARCH WORD0<20:39> ON D/DB<20:39><br>APPLY SEARCH WORD0<40:59><br>DISCHARGE x20C ML if x20C MISS and/or x20B LATE MISS CAPTURE<br>MAINTAIN SEARCH WORD(-1)<60:79> ON D/DB<60:79><br>CAPTURE x80 MATCH/MISS (WORD(-1))<br>ISOLATE x20A ML FROM x20B ML &<br>ISOLATE x20C ML FROM x20D ML |
| 0.5 T to 1 T<br>(EARLY CAPTURE) | MAINTAIN SEARCH WORD1<0:19> ON D/DB<0:19><br>PASS EARLY CAPTURE OF MATCH TO x20B ML<br>GLOBALLY MASK D/DB<20:39><br>MAINTAIN SEARCH WORD0<40:59> ON D/DB<40:59><br>PASS EARLY CAPTURE OF MATCH TO x20D ML<br>GLOBALLY MASK D/DB<60:79><br>ISOLATE x20B ML FROM x20C ML |
| 1 T to 1.5 T<br>STAGES 2 & 4<br>(EVAL)<br>(LATE CAPTURE) | MAINTAIN SEARCH WORD1<0:19> ON D/DB<0:19><br>APPLY SEARCH WORD1<20:39><br>DISCHARGE x20B ML if x20B MISS and/or x20A LATE MISS CAPTURE<br>MAINTAIN SEARCH WORD0<40:59> ON D/DB<40:59><br>APPLY SEARCH WORD0<60:79><br>DISCHARGE x20D ML if x20D MISS and/or x20C LATE MISS CAPTURE<br>ISOLATE x20B ML FROM x20C ML |
| 1.5 T to 2 T<br>(EARLY CAPTURE) | PRECHARGE x20A ML<br>GLOBALLY MASK D/DB<0:19><br>MAINTAIN SEARCH WORD1<20:39> of D/DB<20:39><br>PASS EARLY CAPTURE OF MATCH TO x20C ML<br>GLOBALLY MASK D/DB<40:59><br>MAINTAIN SEARCH WORD0<60:79> ON D/DB<60:79><br>ISOLATE x20A ML FROM x20B ML &<br>ISOLATE x20C ML FROM x20D ML |

TABLE 2

| | | |
|---|---|---|
| 0 T to 0.5 T<br>STAGES 1 & 3 | APPLY SEARCH WORD1<0:19><br>MAINTAIN SEARCH WORD(-1)<60:79> ON D/DB<60:79><br>CAPTURE x80 MATCH/MISS (WORD(-1))<br><br>DISCHARGE x20A ML if x20A MISS | APPLY SEARCH WORD0<40:59><br>MAINTAIN SEARCH WORD0<20:39> ON D/DB<20:39><br>ISOLATE x20A ML FROM x20B ML & ISOLATE x20C ML FROM x20D ML<br>DISCHARGE x20C ML if x20C MISS and/or x20B LATE MISS CAPTURE |
| 0.5 T to 1 T | PASS EARLY CAPTURE OF MATCH TO x20B ML<br>GLOBALLY MASK D/DB<20:39> & ISOLATE x20B ML FROM x20C ML | PASS EARLY CAPTURE OF MATCH TO x20D ML<br>GLOBALLY MASK D/DB<60:79> |
| 1 T to 1.5 T<br>STAGES 2 & 4 | APPLY SEARCH WORD1<20:39><br>MAINTAIN SEARCH WORD1<0:19> ON D/DB<0:19><br>ISOLATE x20B ML FROM x20C ML<br>DISCHARGE x20B ML if x20B MISS and/or x20A LATE MISS CAPTURE | APPLY SEARCH WORD0<60:79><br>MAINTAIN SEARCH WORD0<40:59> ON D/DB<40:59><br><br>DISCHARGE x20D ML if x20D MISS and/or x20C LATE MISS CAPTURE |
| 1.5 T to 2 T | PASS EARLY CAPTURE OF MATCH TO x20C ML<br>GLOBALLY MASK D/DB<40:59> & ISOLATE x20C ML FROM x20D ML | PRECHARGE x20A ML<br>GLOBALLY MASK D/DB<0:19> & ISOLATE x20A ML FROM x20B ML |
| 2 T to 2.5 T<br>STAGES 3 & 1 | APPLY SEARCH WORD1<40:59><br>MAINTAIN SEARCH WORD1<20:39> ON D/DB<20:39><br>ISOLATE x20A ML FROM x20B ML & ISOLATE x20C ML FROM x20D ML<br>DISCHARGE x20C ML if x20C MISS and/or x20B LATE MISS CAPTURE | APPLY SEARCH WORD2<0:19><br>MAINTAIN SEARCH WORD0<60:79> ON D/DB<60:79><br>CAPTURE x80 MATCH/MISS (SEARCH WORD0)<br><br>DISCHARGE x20A ML if x20A MISS |
| 2.5 T to 3 T | PASS EARLY CAPTURE OF MATCH TO x20D ML<br>GLOBALLY MASK D/DB<60:79> | PASS EARLY CAPTURE OF MATCH TO x20B ML<br>GLOBALLY MASK D/DB<20:39> & ISOLATE x20B ML FROM x20C ML |
| 3 T to 3.5 T<br>STAGES 4 & 2 | APPLY SEARCH WORD1<60:79><br>MAINTAIN SEARCH WORD1<40:59> ON D/DB<40:59><br>ISOLATE x20B ML FROM x20C ML<br>DISCHARGE x20D ML if x20D MISS and/or x20C LATE MISS CAPTURE | APPLY SEARCH WORD2<20:39><br>MAINTAIN SEARCH WORD2<0:19> ON D/DB<0:19><br><br>DISCHARGE x20B ML if x20B MISS and/or x20A LATE MISS CAPTURE |
| 3.5 T to 4 T | PRECHARGE x20A ML<br>GLOBALLY MASK D/DB<0:19> & ISOLATE x20A ML FROM x20B ML | PASS EARLY CAPTURE OF MATCH TO x20C ML<br>GLOBALLY MASK D/DB<40:59> & ISOLATE x20C ML FROM x20D ML |

TABLE 2-continued

| | | |
|---|---|---|
| 4 T to 4.5 T STAGES 1 & 3 | APPLY SEARCH WORD3<0:19> MAINTAIN SEARCH WORD1<60:79> ON D/DB<60:79> CAPTURE x80 MATCH/MISS (SEARCH WORD1) DISCHARGE x20A ML IF x20A MISS | APPLY SEARCH WORD2<40:59> MAINTAIN SEARCH WORD2<20:39> ON D/DB<20:39> ISOLATE x20A ML FROM x20B ML & ISOLATE x20C ML FROM x20D ML DISCHARGE x20C ML if x20C MISS and/or x20B LATE MISS CAPTURE |
| 4.5 T to 5 T | PASS EARLY CAPTURE OF MATCH TO x20B ML GLOBALLY MASK D/DB<20:39> & ISOLATE x20B ML FROM x20C ML | PASS EARLY CAPTURE OF MATCH TO x20D ML GLOBALLY MASK D/DB<60:79> |
| 5 T to 5.5 T STAGES 2 & 4 | APPLY SEARCH WORD3<20:39> MAINTAIN SEARCH WORD3<0:19> ON D/DB<0:19> ISOLATE x20B ML FROM x20C ML DISCHARGE x20B ML if x20B MISS and/or x20A LATE MISS CAPTURE | APPLY SEARCH WORD2<60:79> MAINTAIN SEARCH WORD2<40:59> ON D/DB<40:59> DISCHARGE x20D ML if x20D MISS and/or x20C LATE MISS CAPTURE |
| 5.5 T to 6 T | PASS EARLY CAPTURE OF MATCH TO x20C ML GLOBALLY MASK D/DB<40:59> & ISOLATE x20C ML FROM x20D ML | PRECHARGE x20A ML GLOBALLY MASK D/DB<0:19> & ISOLATE x20A ML FROM x20B ML |
| 6 T to 6.5 T STAGES 3 & 1 | APPLY SEARCH WORD3<40:59> MAINTAIN SEARCH WORD3<20:39> ON D/DB<20:39> ISOLATE x20A ML FROM x20B ML & ISOLATE x20C ML FROM x20D ML DISCHARGE x20C ML if x20C MISS and/or x20B LATE MISS CAPTURE | APPLY SEARCH WORD4<0:19> MAINTAIN SEARCH WORD2<60:79> ON D/DB<60:79> CAPTURE x80 MATCH/MISS (SEARCH WORD2) DISCHARGE x20A ML if x20A MISS |
| 6.5 T to 7 T | PASS EARLY CAPTURE OF MATCH TO x20D ML GLOBALLY MASK D/DB<60:79> | PASS EARLY CAPTURE OF MATCH TO x20B ML GLOBALLY MASK D/DB<20:39> & ISOLATE x20B ML FROM x20C ML |
| 7 T to 7.5 T STAGES 4 & 2 | APPLY SEARCH WORD3<60:79> MAINTAIN SEARCH WORD3<40:59> ON D/DB<40:59> ISOLATE x20B ML FROM x20C ML DISCHARGE x20D ML if x20D MISS and/or x20C LATE MISS CAPTURE | APPLY SEARCH WORD4<20:39> MAINTAIN SEARCH WORD4<0:19> ON D/DB<0:19> DISCHARGE x20B ML if x20B MISS and/or x20A LATE MISS CAPTURE |
| 7.5 T to 8 T | PRECHARGE x20A ML GLOBALLY MASK D/DB<0:19> & ISOLATE x20A ML FROM x20B ML | PASS EARLY CAPTURE OF MATCH TO x20C ML GLOBALLY MASK D/DB<40:59> & ISOLATE x20C ML FROM x20D ML |
| 8 T to 8.5 T STAGES 1 & 3 | APPLY SEARCH WORD5<0:19> MAINTAIN SEARCH WORD3<60:79> ON D/DB<60:79> CAPTURE x80 MATCH/MISS (SEARCH WORD3) DISCHARGE x20A ML IF x20A MISS | APPLY SEARCH WORD4<40:59> MAINTAIN SEARCH WORD4<20:39> ON D/DB<20:39> ISOLATE x20A ML FROM x20B ML & ISOLATE x20C ML FROM x20D ML DISCHARGE x20C ML if x20C MISS and/or x20B LATE MISS CAPTURE |

The timing diagram of FIG. 3 also demonstrates alternative embodiments that modify the timing of the connect control signals CON0 and CON1. For example, the dotted lines A and B in FIG. 3 represent an earlier rising edge and a later falling edge of the first connect control signal CON1, respectively. Similarly, the dotted lines C and D in FIG. 3 represent an earlier rising edge and a later falling edge of the zeroth connect control signal CON0, respectively. In the event the connect control signal CON0 (CON1) has a rising edge as shown by the dotted line C (A), then the dual-capture match line signal repeater will operate to capture early miss signals and early match signals during the same time intervals. Nonetheless, late capture of late miss signals will still be provided. Moving the rising edges of the connect control signals CON0 and CON1 forward in time as shown by the dotted lines C and A, respectively, may be less preferred because it typically results in greater power consumption, particularly if the second inverters 32b, 32c and 32d are switched slowly in response to "weak" miss signals (gradual high-to-low transition of a respective match line segment). Slow switching of an inverter results in higher current consumption because it causes a resistive path to form between the power supply lines (Vdd and Vss) when the PMOS and NMOS transistors are simultaneously conductive.

As illustrated by TABLE 3, each CAM array includes a bit/data line control circuit that drives the data lines (D/DB<0:79>) with segments of the search words during the pipelined search operations. These data line driving operations are interleaved with global masking operations that may be implemented using a dedicated mask cell sub-array containing global mask cells. An exemplary dedicated mask cell sub-array is more fully described in commonly assigned U.S. application Ser. No. 10/386,400, filed Mar. 11, 2003, assigned to the present assignee, the disclosure of which is hereby incorporated herein by reference. The entries within TABLE 3 summarize the operations in TABLE 2 that relate to application of search word segments and global masks during the staged segment-to-segment search operations.

TABLE 3

| STAGES | TIME | D/DB <0:19> | D/DB <20:39> | D/DB <40:59> | D/DB <60:79> |
|---|---|---|---|---|---|
| 1 AND 3 | 0 T to 0.5 T | WORD 1 | WORD 0 | WORD 0 | WORD −1 |
| | 0.5 T to 1 T | WORD 1 | MASK | WORD 0 | MASK |
| 2 AND 4 | 1 T to 1.5 T | WORD 1 | WORD 1 | WORD 0 | WORD 0 |
| | 1.5 T to 2 T | MASK | WORD 1 | MASK | WORD 0 |
| 3 AND 1 | 2 T to 2.5 T | WORD 2 | WORD 1 | WORD 1 | WORD 0 |
| | 2.5 T to 3 T | WORD 2 | MASK | WORD 1 | MASK |
| 4 AND 2 | 3 T to 3.5 T | WORD 2 | WORD 2 | WORD 1 | WORD 1 |
| | 3.5 T to 4 T | MASK | WORD 2 | MASK | WORD 1 |
| 1 AND 3 | 4 T to 4.5 T | WORD 3 | WORD2 | WORD 2 | WORD 1 |
| | 4.5 T to 5 T | WORD 3 | MASK | WORD 2 | MASK |
| 2 AND 4 | 5 T to 5.5 T | WORD 3 | WORD 3 | WORD 2 | WORD 2 |
| | 5.5 T to 6 T | MASK | WORD 3 | MASK | WORD 2 |
| 3 AND 1 | 6 T to 6.5 T | WORD 4 | WORD 3 | WORD 3 | WORD 2 |
| | 6.5 T to 7 T | WORD 4 | MASK | WORD 3 | MASK |
| 4 AND 2 | 7 T to 7.5 T | WORD 4 | WORD 4 | WORD 3 | WORD 3 |
| | 7.5 T to 8 T | MASK | WORD 4 | MASK | WORD 3 |

TABLE 3-continued

| STAGES | TIME | D/DB <0:19> | D/DB <20:39> | D/DB <40:59> | D/DB <60:79> |
|---|---|---|---|---|---|
| 1 AND 3 | 8 T to 8.5 T | WORD 5 | WORD 4 | WORD 4 | WORD 3 |
|  | 8.5 T to 9 T | WORD 5 | MASK | WORD 4 | MASK |
| 2 AND 4 | 9 T to 9.5 T | WORD 5 | WORD 5 | WORD 4 | WORD 4 |
|  | 9.5 T to 10 T | MASK | WORD 5 | MASK | WORD 4 |

Figure 5A:
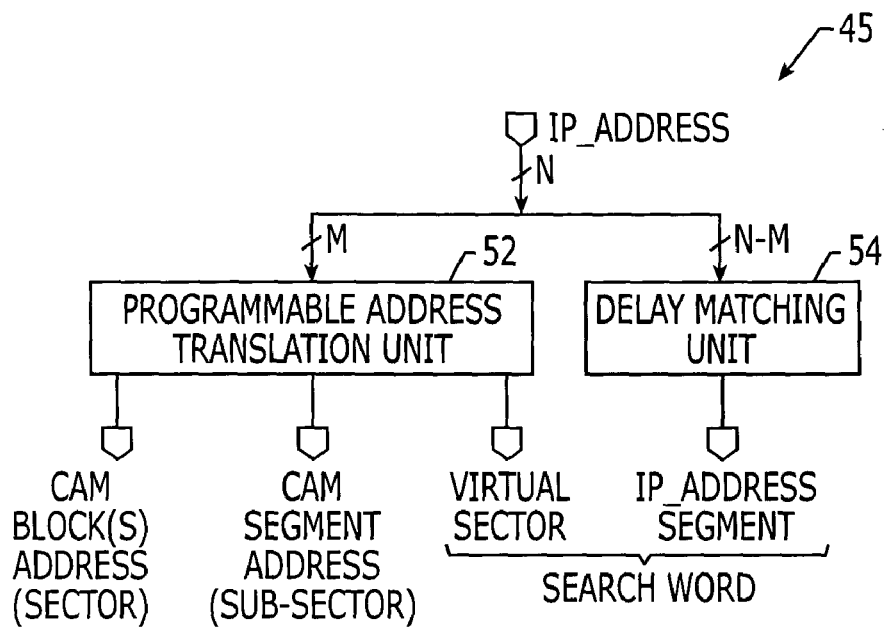
FIG. 5A is a block diagram of an address conversion circuit that is configured to convert a portion of an input address into sector, sub-sector and virtual sector addresses, according to further embodiments of the present invention.

Further embodiments of the present invention utilize an address conversion circuit to support power efficient search operations within large capacity CAM devices, by limiting the number of CAM array blocks that participate in a given search operation. As illustrated by FIG. 5A, an address conversion circuit 45 may include a programmable address translation unit 52 and a delay matching unit 54. The programmable address translation unit 52 is configured to convert a first portion of an input address into a plurality of addresses that may be provided to a CAM device. The input address may, in some cases, constitute an IP network address (shown as IP_ADDRESS). In other cases, the input "address" may constitute a more generic form of look-up/search word that is used to generate a result (e.g., index, routing address, etc.) when ultimately processed through a CAM device. The input address is illustrated as having N bits (e.g., N=32) and the first portion of the input address is illustrated as having M bits (e.g., M=16). The delay matching unit 54 provides a pipeline delay to a second portion of the input address (shown as N-M bits). This pipeline delay is matched to the delay provided by the programmable address translation unit 52. The address conversion circuit 45 may be provided on the same chip or different chip relative to a CAM device(s).

The programmable address translation unit 52 generates three addresses. The first address is shown as a CAM block(s) address, which is also referred to herein as a sector address. This block address may designate an address of one or more CAM array blocks (i.e., sectors) within a CAM device, such that only those CAM array blocks identified by the block address remain active during a respective search operation. The second address is shown as a CAM segment address, which is also referred to herein as a sub-sector address. The CAM segment address may designate an active segment within a CAM array block(s), as explained more fully hereinbelow. The third address is shown as a virtual sector address. This virtual sector address may be provided as part of a search word (i.e., comparand) during a search operation within a selected CAM array block(s). In the illustrated embodiment, the sector address may have a width equal to six bits to thereby provide a maximum of 26=64 possible sector addresses. However, it is typically the case that many M-bit portions of consecutive input addresses will map to the same sector address. Addressable sectors within the CAM device may be of equivalent size (i.e., have the same number of CAM array blocks), however, sectors with different sizes are also possible. The sub-sector address may have a width equal to two bits to thereby provide $2^2$=4 possible segment addresses within a CAM array block(s). Finally, the virtual sector address may have a width equal to eight bits to thereby provide $2^8$=256 possible virtual sector addresses within a CAM array block(s). Thus, the programmable address translation unit 52 may utilize 16 bits of an input address to select between a maximum of 64×4×256=64K addressable "buckets" within a CAM device. The widths of the sector, sub-sector and virtual sector addresses may vary depending on application and CAM device capacity. It is also possible that different first portions of input addresses may map to the same "bucket" within the CAM device.

The programmable address translation unit 52 may include a RAM array (not shown) that is configured to generate a composite address (i.e., sector, sub-sector and virtual sector addresses) in response to the first portion of the input address, which can operate as a read address into the RAM array. A content addressable memory may also be used in combination with the RAM array. These aspects of the programmable address translation unit 52 are more fully illustrated and described in U.S. application Ser. No. 10/613, 245, filed Jul. 3, 2003, assigned to the present assignee, the disclosure of which is hereby incorporated herein by reference (see, e.g., mapper circuits 810, 910 and 1310 in FIGS. 8, 9 and 13, RAM 1810 in FIG. 18 and CAM 1910 and RAM 1920 in FIG. 19 of U.S. application Ser. No. 10/613,245).

Figure 5B:
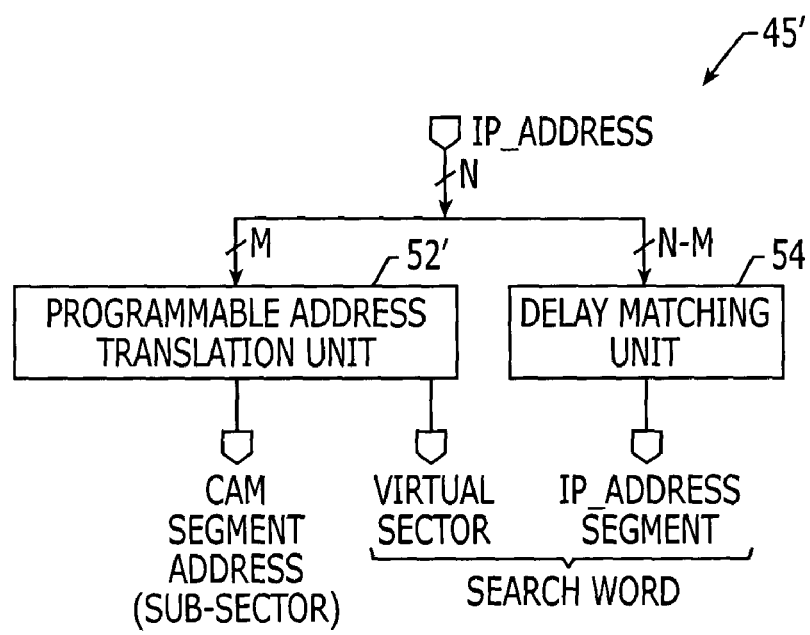
FIG. 5B is a block diagram of an address conversion circuit that is configured to convert a portion of an input address into sub-sector and virtual sector addresses, according to embodiments of the present invention.

FIG. 5B illustrates an alternative address translation unit 45' that is configured to omit the generation of a CAM block(s) address (i.e., sector address). In particular, the programmable address translation unit 52' is configured to generate a CAM segment address (i.e., sub-sector address) and a virtual sector address. The CAM segment address may have a width equal to $\log_2 N_s$, where $N_s$ equals the number of segments within a CAM array. As described more fully hereinbelow with respect to FIG. 6, the value of Ns for the illustrated CAM array 60 is four (4).

Figure 5C:
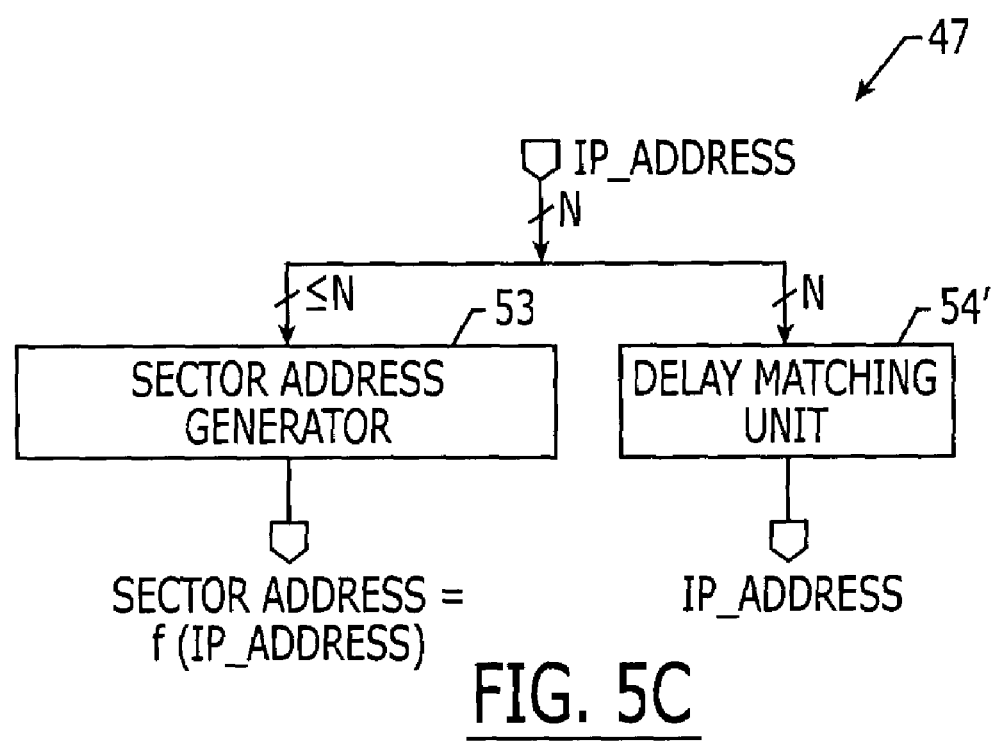
FIG. 5C is a block diagram of an address evaluation circuit according to a further embodiment of the present invention.

In FIG. 5C, a block diagram of an address evaluation circuit 47 is illustrated. This address evaluation circuit 47 includes a sector address generator 53 and a delay matching unit 54'. The delay matching unit 54' may operate to pass all incoming IP_ADDRESS bits (shown as N) to an output thereof, after a predetermined delay. In some embodiments, the output of the delay matching unit 54' may be provided as an input to the address translation unit 45' of FIG. 5B. The sector address generator 53 is illustrated as generating a sector address in response to some portion (or all) of the IP_ADDRESS. In particular, the sector address generator 53 may include internal circuitry therein that is configured to perform one or more functions (f) and/or evaluate one or more properties of the portion of the IP_ADDRESS. In some embodiments, this internal circuitry may comprise a parity bit(s) generation circuit. For example, in the event the IP_ADDRESS has a width of 80 bits, which may be stored as an 80 bit entry within a binary CAM array, the sector address generator 53 may generate a one, two or four bit result. A one bit result may be achieved if the parity bit generation circuit is configured to generate a one bit parity value (e.g., 0=even parity, 1=odd parity) for the entire IP_ADDRESS. A two bit result may be achieved if the parity bit generation circuit is configured to generate a one bit parity value for the first 40 bits and a one bit parity value for the second 40 bits. A four bit result may be may be achieved if the parity bit generation circuit is configured to generate a separate parity value for each group of 20 bits (i.e., IP_ADDRESS<0:19>,<20:39, <40:59>, <60:79>). In this latter case, the CAM device may be configured to have sixteen equivalent-sized sectors, with each sector having one or more CAM array blocks therein that are filled with entries having equivalent parity values, as shown below:

| PARITY BITS | SECTOR |
|---|---|
| 0000 | 0 |
| 0001 | 1 |

-continued

| PARITY BITS | SECTOR |
|---|---|
| 0010 | 2 |
| 0011 | 3 |
| 0100 | 4 |
| 0101 | 5 |
| 0110 | 6 |
| 0111 | 7 |
| 1000 | 8 |
| 1001 | 9 |
| 1010 | 10 |
| 1011 | 11 |
| 1100 | 12 |
| 1101 | 13 |
| 1110 | 14 |
| 1111 | 15 |

Figure 6:
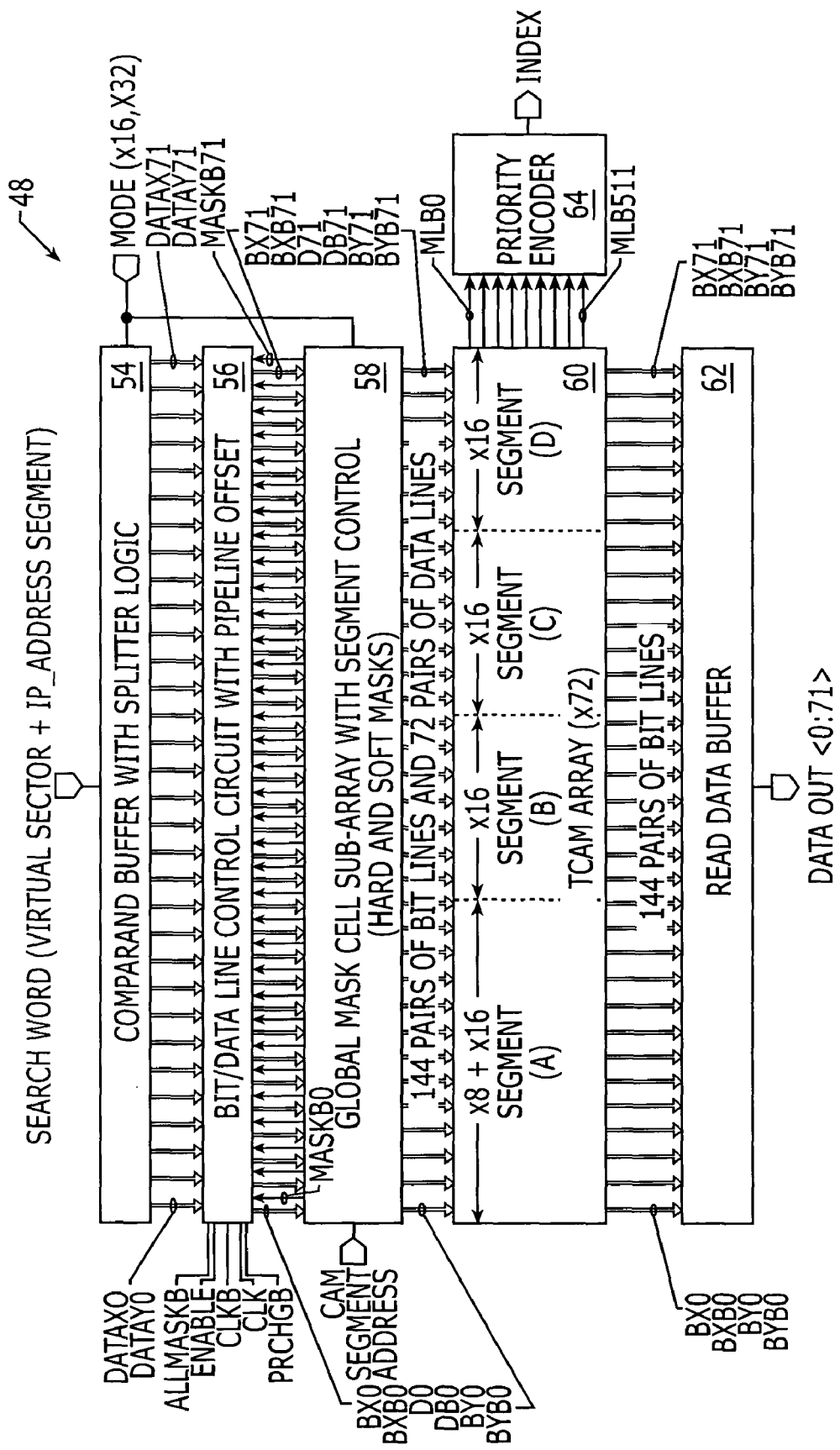
FIG. 6 is a block diagram of a CAM array block according to embodiments of the present invention.

FIG. 6 illustrates a CAM array block 48 having a single CAM array 60 (shown as a ternary CAM array) therein. CAM array blocks according to other embodiments of the present invention may include multiple CAM arrays per block and one or more CAM array blocks may be grouped into sectors within a single-chip or multi-chip CAM device. A comparand buffer with splitter logic 54 is provided to receive an input search word and duplicate portions of the input search word at outputs thereof. As illustrated by FIG. 5, the search word may comprise a virtual sector address and an input address segment (shown as IP_ADDRESS segment), which represents the data to be searched. For purposes of discussion herein, the search word will be treated as having a width equal to 24 (or 40) bits, with eight bits assigned to the virtual sector address and 16 (or 32) bits assigned to the input address segment (i.e., N-M=16 or 32). Other search word widths are also possible. The comparand buffer 54 is responsive to a mode select signal (MODE). When MODE=0 the address segment will be treated as having a width equal to 16 bits, and when MODE=1 the address segment will be treated as having a width equal to 32 bits.

The splitter logic within the comparand buffer 54 is configured to duplicate the input address segment and also convert the binary values of the input address segment to X and Y values that are consistent with lateral XY ternary CAM cells within the CAM array 60. Exemplary ternary CAM cells that may be used in the CAM array 60 are illustrated and described in U.S. application Ser. No. 10/609, 756, filed Jun. 30, 2003, assigned to the present assignee, the disclosure of which is hereby incorporated herein by reference. A search word bit having a binary value of 0 may be translated into X=0 and Y=1 and a search word bit having a binary value of 1 may be translated into X=1 and Y=0. In alternative embodiments, the Y value may be mapped as the true data (i.e., (X=0,Y=1)=1 and (X=1, Y=0)=0). If the mode select signal MODE=0, then the splitter logic may operate to generate the following XY data in response to a 24 bit search word:

DATAX<0:23>=SEARCH WORD<0:23>
DATAX<23:39>=SEARCH WORD<8:23>
DATAX<40:55>=SEARCH WORD<8:23>
DATAX<56:71>=SEARCH WORD<8:23>
DATAY<0:23>=/SEARCH WORD<0:23>
DATAY<23:39>/SEARCH WORD<8:23>
DATAY<40:55>=/SEARCH WORD<8:23>
DATAY<56:71>=/SEARCH WORD<8:23>

Alternatively, if the mode select signal MODE=1, then the splitter logic may operate to generate the following XY data in response to a 40 bit search word:

SEARCH WORD<0:39>=SEARCH WORD<0:39>
DATAX<0:39>=SEARCH WORD<0:39>
DATAX<40:71>=SEARCH WORD<8:39>
DATAY<0:39>=/SEARCH WORD<0:39>
DATAY<40:71>=/SEARCH WORD<8:39>

For purposes of discussion herein, data in either the binary or XY translated format will be treated and referred to herein and in the claims using equivalent terms. Accordingly, the value of SEARCH WORD<0:23> at the input of the comparand buffer 54 will be treated herein as equivalent to (DATAX<0:23>=SEARCH WORD<0:23>, DATAY<0: 23>=/SEARCH WORD<0:23>) at the output of comparand buffer 54. Moreover, reference to "DATAXY<n>" will be treated herein as equivalent to (DATAX<n>, DATAY<n>).

The outputs of the comparand buffer 54 are provided as inputs to a bit/data line control and pipeline offset circuit 56. The pipeline offset circuit may include a plurality of latches that are arranged in stages so that during a search operation, DATAX<56:71> is delayed by one cycle relative to DATAX<40:55>, which is delayed by one cycle relative to DATAX<24:39>, which is delayed by one clock cycle relative to DATAX<0:23>.

The bit/data line control and pipeline offset circuit 56 is responsive to a plurality of control and clock signals, shown as ALLMASKB, ENABLE, CLKB, CLK and PRCHGB. The bit/data line control and pipeline offset circuit 56 is also responsive to a plurality of active low mask assertion signals MASKB<0:71>, which are generated by a global mask cell sub-array (with segment control circuitry) 58. The configuration and operation of the bit/data line control and pipeline circuit 56 and the global mask cell sub-array 58, are more fully described and illustrated in aforementioned '400 application. The global mask cell sub-array (with segment control circuitry) 58 is also responsive to a CAM segment address, which designates an active sub-sector within the CAM array 60 during a respective search operation. This CAM segment address may be a two bit signal that designates one of four active segments (A=(0,0), B=(0,1), C=(1,0) or D=(1,1)), as explained more fully hereinbelow with respect to TABLE 4. However, if the comparand buffer with splitter logic 54 is disposed in a x32 mode (e.g., MODE=1), then two of the four segments with the CAM array 60 will be active with a 32-bit word during search operations, as explained more fully hereinbelow with respect to TABLE 6.

The bit/data line control and pipeline circuit 56 is configured to convert the XY data signals DATAXY<0:71> into differential bit line signals BX<0:71>, BXB<0:71>, BY<0: 71>, BYB<0:71>, when the CAM array 60 is undergoing write operations. The bit/data line control and pipeline circuit 56 is further configured to convert the X data signals DATAX<0:71> into differential data line signals D<0:71> and DB<0:71> when the CAM array 60 is undergoing search operations. Thus, during a search operation, if SEARCH WORD<0:23>=(1100101000 . . . 0110), the bit/data line control circuit 56 will generate the following corresponding differential signals: D<0:23>=(1100101000 . . . 0110) and DB<0:23>=(0011010111 . . . 1001).

The CAM array block 48 also includes a read data buffer 62 that is electrically coupled to the CAM array 60 by the differential bit lines BX<0:71>, BXB<0:71>, BY<0:71> and BYB<0:71>. The read data buffer 62 may include circuitry that is configured to translate the differential XY data on the bit lines into data and mask values, where X,Y=0,1 translates to Data=0 and Mask=inactive; X,Y=1,0 translates to Data=1 and Mask= inactive; and X,Y=0,0 translates to Data=unknown and Mask=active.

In FIG. 6, the comparand buffer with splitter logic 54 and the bit/data line control circuit with pipeline offset 56 are illustrated as being "local" within a respective CAM array block 48. However, in alternative embodiments of the present invention, one or more portions of the comparand buffer with splitter logic 54 and the bit/data line control circuit with pipeline offset 56 may be provided as global circuits. For example, the splitter logic and/or pipeline offset circuitry may be provided as global circuits that supply modified comparand data to each CAM array block, which has already undergone a pipeline offset operation. However, for purposes of discussion herein, this circuitry will be treated as being local to each CAM array block.

Operation of the CAM array block 48 during consecutive pipelined search operations will now be described more fully with reference to TABLES 4–6. These tables assume that the CAM array 60 has four segments of CAM cells therein. These segments are labeled as A, B, C and D. The match line segments associated with the CAM array 60 are similar to those illustrated by FIG. 2; however, instead of having four equivalent x20 segments, the CAM array 60 of FIG. 6 has one x24 segment (A) and three x16 segments (B, C and D). The match line signal MLBn in FIG. 2 corresponds to the match line signals MLB0–MLB511 in FIG. 6, which are received by a priority encoder 64. This priority encoder 64, which may be of conventional design, is configured to generate an index value (INDEX) in response to each search operation. Moreover, whereas TABLES 1–3 illustrate pipelined search operations using 80-bit search words, TABLES 4–5 illustrate search operations using 24-bit search words (for MODE=0) and TABLE 6 illustrates search operations using 40-bit search words (for MODE=1). For purposes of discussion herein, the timing diagram illustrated by FIG. 3 will apply to the timing intervals illustrated by TABLES 4–6.

In TABLES 4–5, the time interval from 0T to 1T represents a first stage of a segment-to-segment search operation with respect to a first search word. This first search word represents a 24-bit comparand having an 8-bit virtual sector field (VSEG1) and a 16-bit data field (WORD 1). Both the virtual sector field and data field are applied to data lines associated with segment A of the CAM array 60 (i.e., D/DB<0:23>). In this case, the 2-bit CAM segment address generated by the programmable address translation unit 52' of FIG. 5B may equal (0,0), to thereby designate segment A as the segment that receives WORD 1 during the search operation. During the second, third and fourth stages of the search operation with respect to WORD 1, which span time intervals 1T–4T, global mask signals (MASK (1)) are applied to data lines D/DB<24:39>, D/DB<40:55> and D/DB<56:71>, respectively. These global mask signals, which are controlled by the global mask cell sub-array 58 of FIG. 6, insure that any active high match signal associated with segment A of the CAM array 60 after the first stage of the search operation, will be preserved during the second, third and fourth stages of the search operation with respect to WORD 1.

The time interval from 2T to 3T represents a first stage of a segment-to-segment search operation with respect to a second search word. This second search word represents a 24-bit comparand having an 8-bit virtual sector field (VSEG2) and a 16-bit data field (WORD 2). The virtual sector field (VSEG2) and a global mask field (MASK (2)) are applied to data lines associated with segment A of the CAM array 60 during the first stage and the data field (WORD 2) is applied to data lines associated with segment B of the CAM array 60 during the second stage. In this case, the 2-bit CAM segment address generated by the programmable address translation unit 52' of FIG. 5B may equal (0,1), to thereby designate segment B as the segment that receives WORD 2 during the search operation. During the third and fourth stages of the search operation with respect to WORD 2, which span time intervals 4T–6T, global mask signals (MASK (2)) are applied to data lines D/DB<40:55> and D/DB<56:71>, respectively.

The time interval from 4T to 5T represents a first stage of a segment-to-segment search operation with respect to a third search word. This third search word represents a 24-bit comparand having an 8-bit virtual sector field (VSEG3) and a 16-bit data field (WORD 3). The virtual sector field (VSEG3) and a global mask field (MASK (3)) are applied to the data lines associated with segment A of the CAM array 60 during the first stage, and another global mask field (MASK (3)) is applied to data lines associated with segment B during the second stage. Then, the data field (WORD 3) is applied to data lines associated with segment C of the CAM array 60 during the third stage. In this case, the 2-bit CAM segment address generated by the programmable address translation unit 52' of FIG. 5B may equal (1,0), to thereby designate segment C as the segment that receives WORD 3 during the search operation. During the fourth stage of the search operation with respect to WORD 3, which spans the time interval 7T–8T, global mask signals (MASK (3)) are applied to the data lines D/DB<56:71>.

The time interval from 6T to 7T represents a first stage of a segment-to-segment search operation with respect to a fourth search word. This fourth search word represents a 24-bit comparand having an 8-bit virtual sector field (VSEG4) and a 16-bit data field (WORD 4). Both the virtual sector field and data field are applied to data lines associated with segment A of the CAM array 60. In this case, the 2-bit CAM segment address may equal (0,0), to thereby designate segment A as the segment that receives WORD 4 during the search operation. During the second, third and fourth stages of the search operation with respect to WORD 4, which span time intervals 7T–10T, global mask signals (MASK (4)) are applied to data lines D/DB<24:39>, D/DB<40:55> and D/DB<56:71>, respectively.

The time interval from 8T to 9T represents a first stage of a segment-to-segment search operation with respect to a fifth search word. This fifth search word represents a 24-bit comparand having an 8-bit virtual sector field (VSEG5) and a 16-bit data field (WORD 5). The virtual sector field (VSEG5) and a global mask field (MASK (5)) are applied to data lines associated with segment A of the CAM array 60 during the first stage, and the data field (WORD 5) is applied to data lines associated with segment B of the CAM array 60 during the second stage. In this case, the 2-bit CAM segment address (sub-sector) may equal (0,1), to thereby designate segment B as the segment that receives WORD 5 during the search operation. During the third and fourth stages of the search operation with respect to WORD 5, which span time intervals 10T–12T, global mask signals (MASK (5)) are applied to data lines D/DB<40:55> and D/DB<56:71>, respectively.

TABLE 4

| STAGES | TIME | D/DB<0:7> & DB<8:23> | D/DB<24:39> | D/DB<40:55> | D/DB<56:71> |
|---|---|---|---|---|---|
| 1 AND 3 | 0 T to 0.5 T | VSEG 1 & WORD 1 | MASK (0) | WORD 0 | WORD −1 |
|  | 0.5 T to 1 T | VSEG1 & WORD 1 | MASK | WORD 0 | MASK |
| 2 AND 4 | 1 T to 1.5 T | VSEG1 & WORD 1 | MASK (1) | WORD 0 | MASK (0) |
|  | 1.5 T to 2 T | MASK | MASK (1) | MASK | MASK (0) |
| 3 AND 1 | 2 T to 2.5 T | VSEG2 & MASK (2) | MASK (1) | MASK (1) | MASK (0) |
|  | 2.5 T to 3 T | VSEG2 & MASK (2) | MASK | MASK (1) | MASK |
| 4 AND 2 | 3 T to 3.5 T | VSEG2 & MASK (2) | WORD 2 | MASK (1) | MASK (1) |
|  | 3.5 T to 4 T | MASK | WORD 2 | MASK | MASK (1) |
| 1 AND 3 | 4 T to 4.5 T | VSEG3 & MASK (3) | WORD2 | MASK (2) | MASK (1) |
|  | 4.5 T to 5 T | VSEG3 & MASK (3) | MASK | MASK (2) | MASK |
| 2 AND 4 | 5 T to 5.5 T | VSEG3 & MASK (3) | MASK (3) | MASK (2) | MASK (2) |
|  | 5.5 T to 6 T | MASK | MASK (3) | MASK | MASK (2) |
| 3 AND 1 | 6 T to 6.5 T | VSEG4 & WORD 4 | MASK (3) | WORD 3 | MASK (2) |
|  | 6.5 T to 7 T | VSEG4 & WORD 4 | MASK | WORD 3 | MASK |
| 4 AND 2 | 7 T to 7.5 T | VSEG4 & WORD 4 | MASK (4) | WORD 3 | MASK (3) |
|  | 7.5 T to 8 T | MASK | MASK (4) | MASK | MASK (3) |
| 1 AND 3 | 8 T to 8.5 T | VSEG5 & MASK (5) | MASK (4) | MASK (4) | MASK (3) |
|  | 8.5 T to 9 T | VSEG5 & MASK (5) | MASK | MASK (4) | MASK |
| 2 AND 4 | 9 T to 9.5 T | VSEG5 & MASK (5) | WORD 5 | MASK (4) | MASK (4) |
|  | 9.5 T to 10 T | MASK | WORD 5 | MASK | MASK (4) |

In TABLE 5, which is similar to TABLE 2, additional detailed descriptions of the operations performed by the CAM array 60 of FIG. 6 are provided. This CAM array 60 may include the segmented match lines and match line control circuitry illustrated by FIG. 2, with x20A ML (segment A), x20B ML (segment B), x20C ML (segment C) and x20D ML (segment D) in FIG. 2 being replaced by x24A ML, x16B ML, x16C ML and x16D ML, respectively. The match line segments x24A ML, x16B ML, x16C ML and x16D ML, which are identified in TABLE 5, will operate to pass active high match signals from left-to-right across the CAM array 60 whenever these segments are globally masked during a stage of a search operation.

TABLE 5

| 0 T to 0.5 T | APPLY VIRTUAL SEGMENT1 AND WORD1<8:23> to D/DB<0:23> | APPLY WORD0<40:55> |
|---|---|---|
| STAGES 1 & 3 | MAINTAIN WORD(−1)<56:71> ON D/DB<56:71> | MAINTAIN MASK0<24:39> ON D/DB<24:39> |
|  | CAPTURE x72 MATCH/MISS (VIRTUAL SEGMENT(−1) AND WORD(−1)) | ISOLATE x24A ML FROM x16B ML & ISOLATE x16C ML FROM x16D ML |
|  | DISCHARGE x24A ML if x24A MISS | DISCHARGE x16C ML if x16C MISS and/or x16B MISS CAPTURE |
| 0.5 T to 1 T | PASS CAPTURE OF MATCH (IF ANY) TO x16B ML | PASS CAPTURE OF MATCH (IF ANY) TO x16D ML |
|  | GLOBALLY MASK D/DB<24:39> & ISOLATE x16B ML FROM x16C ML | GLOBALLY MASK D/DB<56:71> |
| 1 T to 1.5 T | APPLY MASK1 TO D/DB<24:39> | APPLY MASK0 TO D/DB<56:71> |
| STAGES 2 & 4 | MAINTAIN VIRTUAL SEGMENT1 AND WORD1<8:23> ON D/DB<0:23> | MAINTAIN WORD0<40:55> ON D/DB<40:55> |
|  | ISOLATE x16B ML FROM x16C ML |  |
|  | DISCHARGE x16B ML if x16A MISS CAPTURE | DISCHARGE x16D ML if x16C MISS CAPTURE |
| 1.5 T to 2 T | PASS CAPTURE OF MATCH (IF ANY) TO x16C ML | PRECHARGE x24A ML |
|  | GLOBALLY MASK D/DB<40:55> & ISOLATE x16C ML FROM x16D ML | GLOBALLY MASK D/DB<0:23> & ISOLATE x24A ML FROM x16B ML |
| 2 T to 2.5 T | APPLY MASK1 TO D/DB<40:55> | APPLY VIRTUAL SEGMENT2 AND |
| STAGES 3 & 1 |  | MASK2<8:23> to D/DB<0:23> |
|  | MAINTAIN MASK1 ON D/DB<24:39> | MAINTAIN MASK0 ON D/DB<56:71> |
|  | ISOLATE x24A ML FROM x16B ML & ISOLATE x16C ML FROM x16D ML | CAPTURE x72 MATCH/MISS (VIRTUAL SEGMENT0 AND WORD0) |
|  | DISCHARGE x16C ML if x16B MISS CAPTURE | DISCHARGE x24A ML if x24A MISS |
| 2.5 T to 3 T | PASS CAPTURE OF MATCH (IF ANY) TO x16D ML | PASS CAPTURE OF MATCH (IF ANY) TO x16B ML |
|  | GLOBALLY MASK D/DB<56:71> | GLOBALLY MASK D/DB<24:39> & ISOLATE x16B ML FROM x16C ML |
| 3 T to 3.5 T | APPLY MASK1 TO D/DB<56:71> | APPLY WORD2<24:39> TO D/DB<24:39> |
| STAGES 4 & 2 | MAINTAIN MASK1 ON D/DB<40:55> | MAINTAIN VIRTUAL SEGMENT2 AND MASK2<8:23> ON D/DB<0:23> |
|  | ISOLATE x16B ML FROM x16C ML |  |
|  | DISCHARGE x16D ML if x16C MISS CAPTURE | DISCHARGE x16B ML if x16B MISS and/or x16A MISS CAPTURE |
| 3.5 T to 4 T | PRECHARGE x24A ML | PASS CAPTURE OF MATCH (IF ANY) TO x16C ML |
|  | GLOBALLY MASK D/DB<0:23> & ISOLATE x24A ML FROM x16B ML | GLOBALLY MASK D/DB<40:55> & ISOLATE x16C ML FROM x16D ML |

TABLE 5-continued

| | | |
|---|---|---|
| 4 T to 4.5 T | APPLY VIRTUAL SEGMENT3 AND MASK3<8:23> TO D/DB<0:23> | APPLY MASK2 TO D/DB<40:55> |
| STAGES 1 & 3 | MAINTAIN MASK1<56:71> ON D/DB<56:71> | MAINTAIN SEARCH WORD2<24:39> ON D/DB<24:39> |
| | CAPTURE x72 MATCH/MISS (VIRTUAL SEGMENT1 AND WORD1) | ISOLATE x24A ML FROM x16B ML & ISOLATE x16C ML FROM x16D ML |
| | DISCHARGE x24A ML IF x24A MISS | DISCHARGE x16C ML if x16B MISS CAPTURE |
| 4.5 T to 5 T | PASS CAPTURE OF MATCH (IF ANY) TO x16B ML | PASS CAPTURE OF MATCH (IF ANY) TO x16D ML |
| | GLOBALLY MASK D/DB<24:39> & ISOLATE x16B ML FROM x16C ML | GLOBALLY MASK D/DB<56:71> |
| 5 T to 5.5 T | APPLY MASK3<24:39> TO D/DB<24:39> | APPLY MASK2<56:71> TO D/DB<56:71> |
| STAGES 2 & 4 | MAINTAIN VIRTUAL SEGMENT3 AND MASK3<8:23> ON D/DB<0:23> ISOLATE x16B ML FROM x16C ML | MAINTAIN MASK2<40:55> ON D/DB<40:55> |
| | DISCHARGE x16B ML if x24A MISS CAPTURE | DISCHARGE x16D ML if x16C MISS CAPTURE |
| 5.5 T to 6 T | PASS CAPTURE OF MATCH (IF ANY) TO x16C ML | PRECHARGE x24A ML |
| | GLOBALLY MASK D/DB<40:55> & ISOLATE x16C ML FROM x16D ML | GLOBALLY MASK D/DB<0:23> & ISOLATE x24A ML FROM x16B ML |
| 6 T to 6.5 T | APPLY WORD3<40:55> TO D/DB<40:55> | APPLY VIRTUAL SEGMENT4 AND WORD4<8:23> TO D/DB<0:23> |
| STAGES 3 & 1 | MAINTAIN MASK3<24:39> ON D/DB<24:39> | MAINTAIN MASK2<56:71> ON D/DB<56:71> |
| | ISOLATE x24A ML FROM x16B ML & ISOLATE x16C ML FROM x16D ML | CAPTURE x72 MATCH/MISS (VIRTUAL SEGMENT2 AND WORD2) |
| | DISCHARGE x16C ML if x20C MISS and/or x16B MISS CAPTURE | DISCHARGE x24A ML if x24A MISS |
| 6.5 T to 7 T | PASS CAPTURE OF MATCH (IF ANY) TO x16D ML | PASS CAPTURE OF MATCH (IF ANY) TO x16B ML |
| | GLOBALLY MASK D/DB<56:71> | GLOBALLY MASK D/DB<24:39> & ISOLATE x16B ML FROM x16C ML |
| 7 T to 7.5 T | APPLY MASK3<56:71> TO D/DB<56:71> | APPLY MASK4<24:39> TO D/DB<24:39> |
| STAGES 4 & 2 | MAINTAIN WORD3<40:55> ON D/DB<40:55> | MAINTAIN VIRTUAL SEGMENT4 AND WORD4<8:23> ON D/DB<0:23> |
| | ISOLATE x16B ML FROM x16C ML | |
| | DISCHARGE x16D ML if x16C MISS CAPTURE | DISCHARGE x16B ML if x24A MISS CAPTURE |
| 7.5 T to 8 T | PRECHARGE x24A ML | PASS CAPTURE OF MATCH (IF ANY) TO x16C ML |
| | GLOBALLY MASK D/DB<0:23> & ISOLATE x24A ML FROM x16B ML | GLOBALLY MASK D/DB<40:55> & ISOLATE x16C ML FROM x16D ML |
| 8 T to 8.5 T | APPLY VIRTUAL SEGMENT5 AND MASK5<8:23> TO D/DB<0:23> | APPLY MASK4<40:55> TO D/DB<40:55> |
| STAGES 1 & 3 | MAINTAIN MASK3<56:71> ON D/DB<56:71> | MAINTAIN MASK4<24:39> ON D/DB<24:39> |
| | CAPTURE x72 MATCH/MISS (VIRTUAL SEGMENT3 AND WORD3) | ISOLATE x24A ML FROM x16B ML & ISOLATE x16C ML FROM x16D ML |
| | DISCHARGE x24A ML IF x24A MISS | DISCHARGE x16C ML if x16B MISS CAPTURE |

In TABLE 6, the time interval from 0T to 2T represents first and second stages of a segment-to-segment search operation with respect to a first search word. This first search word represents a 40-bit comparand having an 8-bit virtual sector field (VSEG1) and a 32-bit data field (WORD 1). The virtual sector field and data field are applied to data lines associated with segments A and B of the CAM array 60 during the first and second stages. In this case, the 2-bit CAM segment address generated by the programmable address translation unit 52' of FIG. 5B may equal (0,0), to thereby designate segments A and B as the segments that receive WORD 1 during the search operation. This occurs when the mode select signal MODE=1, which reflects a 32-bit address segment. During the third and fourth stages of the search operation with respect to WORD 1, which span time intervals 2T–4T, global mask signals (MASK (1)) are applied to data lines D/DB<40:55> and D/DB<56:71>, respectively.

The time interval from 2T to 4T represents the first and second stages of a segment-to-segment search operation with respect to a second search word. This second search word represents a 40-bit comparand having an 8-bit virtual sector field (VSEG2) and a 32-bit data field (WORD 2). The virtual sector field (VSEG2) and data field WORD 2 are applied to the data lines associated with segments A and B of the CAM array 60 during the first and second stages. In this case, the 2-bit CAM segment address may equal (0,0) and the mode select signal MODE=1, to thereby designate segments A and B as the segments that receive WORD 2 during the search operation. During the third and fourth stages of the search operation with respect to WORD 2, which span time intervals 4T–6T, global mask signals (MASK (2)) are applied to data lines D/DB<40:55> and D/DB<56:71>, respectively.

The time interval from 4T to 6T represents the first and second stages of a segment-to-segment search operation with respect to a third search word. This third search word represents a 40-bit comparand having an 8-bit virtual sector field (VSEG3) and a 32-bit data field (WORD 3). The virtual sector field (VSEG3) and two 16-bit global mask fields (MASK (3)) are applied to the data lines associated with segments A and B of the CAM array 60 during the first and second stages. Accordingly, if any match is detected in segment A with respect to the virtual sector field (VSEG3), that match will be passed across the x24 match line segment in segment A of the array and the x16 match line segment in segment B of the array. In this case, the 2-bit CAM segment address may equal (0,1) and the mode select signal MODE=1, to thereby designate segments C and D as the segments that receive WORD 3 during the search operation. During the third and fourth stages of the search operation with respect to WORD 3, which span time intervals 6T–8T, respective 16-bit portions of WORD 3 are applied to data lines D/DB<40:55> and D/DB<56:71>, respectively.

The time interval from 6T to 8T represents the first and second stages of a segment-to-segment search operation with respect to a fourth search word. This fourth search word represents a 40-bit comparand having an 8-bit virtual sector field (VSEG4) and a 32-bit data field (WORD 4). The virtual sector field (VSEG4) and data field WORD 4 are applied to the data lines associated with segments A and B of the CAM array 60 during the first and second stages. In this case, the 2-bit CAM segment address may equal (0,0) and the mode select signal MODE=1, to thereby designate segments A and B as the segments that receive WORD 4 during the search operation. During the third and fourth stages of the search operation with respect to WORD 4, which span time intervals 8T–10T, global mask signals (MASK (4)) are applied to data lines D/DB<40:55> and D/DB<56:71>, respectively.

Finally, the time interval from 8T to 10T represents the first and second stages of a segment-to-segment search operation with respect to a fifth search word. The virtual sector field (VSEG5) and data field (WORD 5) are applied to the data lines associated with segments A and B during the first and second stages. During the third and fourth stages of the search operation with respect to WORD 5, which span time intervals 10T-12T, global mask signals (MASK (5)) are applied to data lines D/DB<40:55> and D/DB<56:71>, respectively. Thus, the operations in Table 6 are similar to those of TABLES 4–5, however, two segments of the CAM array 60 are active with portions of the 32-bit data field during each search operation.

tion, a bit map selector (BIT MAP), at least two operands (shown as OPR1 and OPR2) and a result field (RESULT). A multi-port memory 84 is also provided. This multi-port memory 84 may contain various forms of header data (link layer address, net layer source address, net layer destination address, source address, destination address, version, flags, payload type, sync source ID, etc.), which are stored within rows of the memory 84. The illustrated memory 84 is responsive to a plurality of addresses. The first address (ADDR1) and second address (ADDR2) represent read addresses and the third address (ADDR3) represents a write address. The first and second addresses are defined by the OPR1 and OPR2 fields within the microcode 82, respectively. During a read operation, data read from the first address (ADDR1) is output through the first data port (DATA1) and data read from the second address (ADDR2) is output through the second data port (DATA2). The first and second data ports are illustrated as supporting 64-bit word widths.

A map table 88 is also provided. The map table may be a random access memory (RAM), having a predetermined capacity (shown as 256 rows by 502 columns). The bit map selector field (BIT MAP), which is illustrated as having a width equal to 8 bits, generates a read address into the map

TABLE 6

| STAGES | TIME | D/DB<0:7> & DB<8:23> | D/DB<24:39> | D/DB<40:55> | D/DB<56:71> |
|---|---|---|---|---|---|
| 1 AND 3 | 0 T to 0.5 T | VSEG 1 & WORD 1 | MASK (0) | WORD 0 | WORD –1 |
|  | 0.5 T to 1 T | VSEG1 & WORD 1 | MASK | WORD 0 | MASK |
| 2 AND 4 | 1 T to 1.5 T | VSEG1 & WORD 1 | WORD 1 | WORD 0 | WORD 0 |
|  | 1.5 T to 2 T | MASK | WORD 1 | MASK | WORD 0 |
| 3 AND 1 | 2 T to 2.5 T | VSEG2 & WORD 2 | WORD 1 | MASK (1) | WORD 0 |
|  | 2.5 T to 3 T | VSEG2 & WORD 2 | MASK | MASK (1) | MASK |
| 4 AND 2 | 3 T to 3.5 T | VSEG2 & WORD 2 | WORD 2 | MASK (1) | MASK (1) |
|  | 3.5 T to 4 T | MASK | WORD 2 | MASK | MASK (1) |
| 1 AND 3 | 4 T to 4.5 T | VSEG3 & MASK (3) | WORD2 | MASK (2) | MASK (1) |
|  | 4.5 T to 5 T | VSEG3 & MASK (3) | MASK | MASK (2) | MASK |
| 2 AND 4 | 5 T to 5.5 T | VSEG3 & MASK (3) | MASK (3) | MASK (2) | MASK (2) |
|  | 5.5 T to 6 T | MASK | MASK (3) | MASK | MASK (2) |
| 3 AND 1 | 6 T to 6.5 T | VSEG4 & WORD 4 | MASK (3) | WORD 3 | MASK (2) |
|  | 6.5 T to 7 T | VSEG4 & WORD 4 | MASK | WORD 3 | MASK |
| 4 AND 2 | 7 T to 7.5 T | VSEG4 & WORD 4 | WORD 4 | WORD 3 | WORD 3 |
|  | 7.5 T to 8 T | MASK | WORD 4 | MASK | WORD 3 |
| 1 AND 3 | 8 T to 8.5 T | VSEG5 & WORD 5 | WORD 4 | MASK (4) | WORD 3 |
|  | 8.5 T to 9 T | VSEG5 & WORD 5 | MASK | MASK (4) | MASK |
| 2 AND 4 | 9 T to 9.5 T | VSEG5 & WORD 5 | WORD 5 | MASK (4) | MASK (4) |
|  | 9.5 T to 10 T | MASK | WORD 5 | MASK | MASK (4) |

As illustrated by TABLES 4–6, relatively narrow search words may be searched within a wider CAM array by using global masks to support pipelined search operations. These search operations, which are performed in a staged segment-to-segment manner, have equivalent latency and, therefore, can be performed without the occurrence of pipeline bubbles. Moreover, the programmability of the soft masks within the global mask cell sub-array, which is more fully described in the aforementioned '400 application, can be used to support a greater number of modes (e.g., x8, x16, x24 and x32 modes, even where the mode select signal MODE remains a 2-bit signal) within the CAM array block 48. The width of the virtual sector field (VSEG) can also be varied depending on application.

Figure 7:
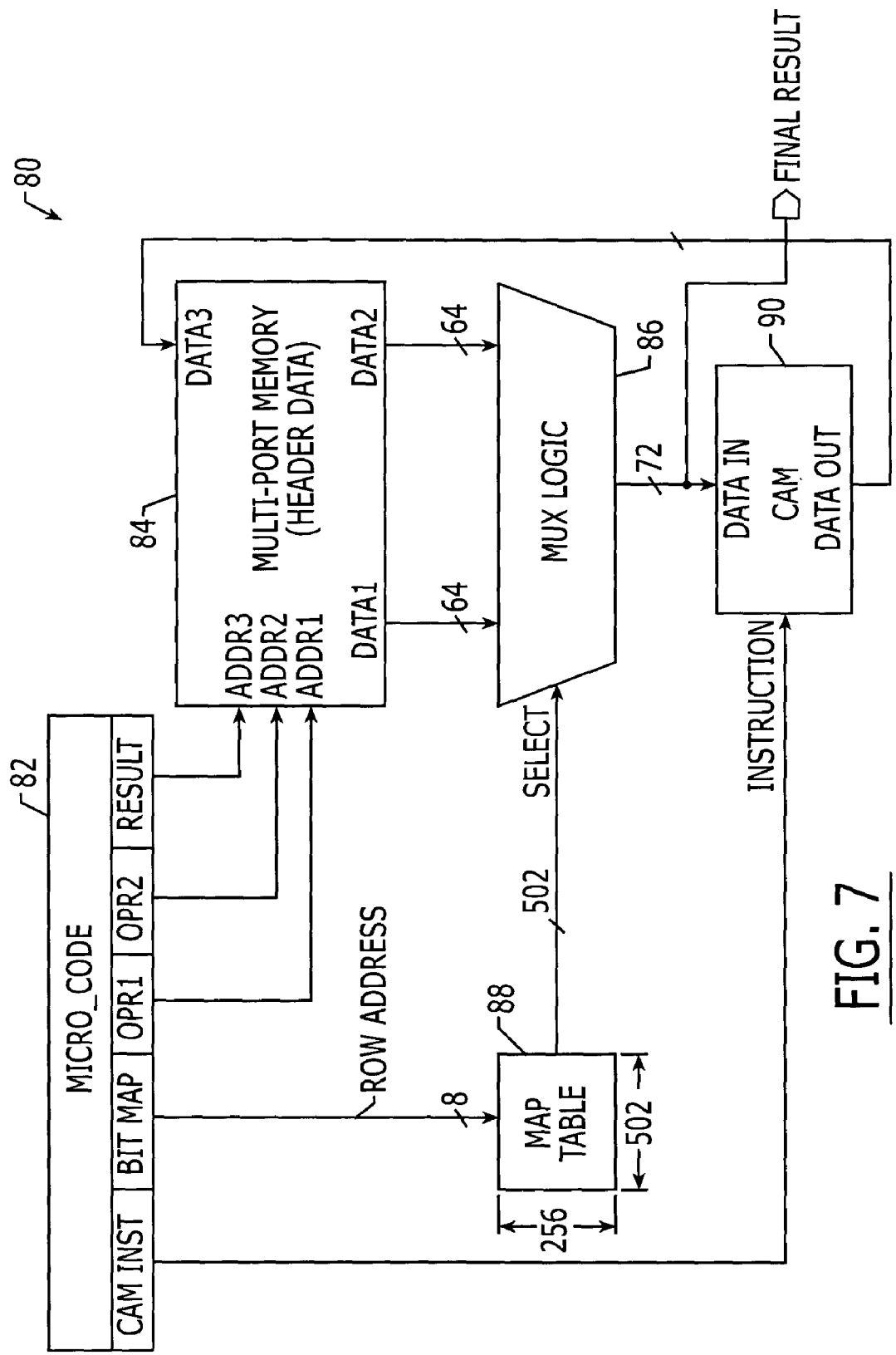
FIG. 7 illustrates an integrated circuit system that uses a CAM device to support bit repacking.

Referring now to FIG. 7, a system application for a CAM device 90 includes a central processing unit 80 that utilizes the CAM device 90 to support efficient bit repacking. The central processing unit 80 is illustrated as including microcode 82 having fields therein that include a CAM instructable 88. During a read operation, the map table 88 generates a 502-bit word, which operates as a select control word (SELECT) to funnel logic. This funnel logic is shown as multiplexer logic 86 in the illustrated embodiment. The multiplexer logic 86 may actually represent 72 128-to-1 multiplexers, in the illustrated embodiment. Each of these multiplexers is responsive to a 7-bit select signal ($2^7$=1 28). Thus, the 502-bit word can provide all 72 7-bit select signals (7×72=502). Based on this configuration of the funnel logic, any 72-bit combination of the 128 bits of data from the first and second data ports (DATA1 and DATA2) can be achieved, depending on how the 256 entries within the map table are programmed. This 72-bit result is provided as a comparand (i.e., search word) to a CAM device 90, which may be external to the processing unit 80. The CAM device 90 is responsive to a CAM instruction (e.g., read, write, search), which may be defined by the instruction field within the microcode 82. If the 72-bit result is used as a search word during a search operation, the CAM device 90 may output an index at the data output port (DATA OUT). This index may represent an address of a matching entry within the CAM device 90. In alternative embodiments, the CAM device 90 may include an additional memory device (e.g., RAM) and the index may be used as a read address into the additional memory device. The read data derived from the additional memory device may be provided to the data output port (DATA OUT) of the CAM device 90. The data output from the CAM device 90 is provided as write data to the third data port (DATA3) of the memory 84. This data is written to the address defined by the result field within the microcode 82. In this manner, various combinations of header data from various locations within the memory 84 may be "mapped" to a result (DATA OUT) that is then stored in the memory 84. Although illustrated as separate elements that may be provided on separate integrated circuit chips, the elements of FIG. 7 may be provided on a single chip or on multiple chips within one or more packages.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
a CAM array block that is configured to perform a search operation in a staged segment-to-segment manner using a plurality of hybrid comparands that are pipelined into said CAM array block during consecutive stages of the search operation, with each of the plurality of hybrid comparands comprising a virtual sector field and a data field.

2. The device of claim 1, wherein said CAM array block is responsive to a segment address, which identifies an active segment of CAM cells in said CAM array block.

3. The device of claim 2, wherein the data field is derived from a first portion of an input address; and wherein the virtual sector field and the segment address are derived from a second portion of the input address.

4. The device of claim 1, wherein said CAM array block comprises:
a CAM array; and
a global mask cell sub-array that is electrically coupled to said CAM array.

5. The device of claim 4, wherein said CAM array block further comprises:
a bit/data line control circuit that is electrically coupled to said CAM array by bit lines and data lines and has inputs that are responsive mask assertion signals generated by said global mask cell sub-array.

6. An integrated circuit device, comprising:
a CAM array block that is configured to perform a search operation in a staged segment-to-segment manner using a plurality of comparands that are pipelined into said CAM array block during consecutive stages of the search operation, said CAM array block comprising at least one multi-segment CAM array and a global mask cell sub-array that is responsive to a segment address.

7. The device of claim 6, wherein said global mask cell sub-array is responsive to a mode select signal.

8. The device of claim 6, wherein the comparands are hybrid comparands that comprise a virtual sector field and a data field.

9. An integrated circuit system, comprising:
a programmable address translation unit that is configured to generate a CAM segment address and a virtual sector address in response to a first portion of an input address; and
a CAM device that is responsive to the CAM segment address and is configured to treat the virtual sector address and a second portion of the input address as respective fields of a search word during pipelined search operations.

10. The system of claim 9, wherein said CAM device comprises a CAM array block having a global mask cell sub-array therein that is responsive to the CAM segment address.

11. A content address memory (CAM) device, comprising:
a CAM array having a plurality of segments therein;
a bit/data line control circuit that is electrically coupled to said CAM array by bit lines and data lines; and
a global mask cell sub-array that is electrically coupled to said bit/data line control circuit and is responsive to a segment address signal that designates which ones of the plurality of segments are active and which other ones of the plurality of segments are globally masked during a staged segment-to-segment search operation.

12. The CAM device of claim 11, wherein said global mask cell sub-array is further responsive to a mode select signal that specifies an active width of search words applied to said CAM array during search operations.

13. The CAM device of claim 11, wherein said global mask cell sub-array is electrically coupled to the bit lines.

14. An integrated circuit system, comprising:
a programmable address translation unit that is configured to generate a CAM segment address in response to a first portion of an input address; and
a CAM device that is responsive to a second portion of the input address, said CAM device comprising:
a segmented CAM array; and
a global mask cell sub-array that is configured to specify location of global masks provided to said segmented CAM array during search operations and is responsive to the CAM segment address.

15. The system of claim 14, wherein the CAM segment address designates which portions of said segmented CAM array are actively searched and which other portions of said segmented CAM array are globally masked during a respective search operation.

16. The system of claim 14, wherein said CAM device further comprises a bit/data line control circuit that is electrically coupled to said segmented CAM array by bit lines and data lines.

17. The system of claim 16, wherein said bit/data line control circuit is configured to receive mask assertion signals from said global mask cell sub-array.

18. The system of claim 14, wherein said global mask cell sub-array is responsive to a mode select signal.

19. The system of claim 14, wherein said segmented CAM array comprises XY ternary CAM cells.

20. The system of claim 14, wherein said global mask cell sub-array comprises hard and soft mask cells therein.

21. The system of claim 14, wherein said programmable address translation unit is further configured to generate a virtual sector address in response to the first portion of the input address; and wherein said CAM device is configured to treat the second portion of the input address and the virtual sector address as a hybrid comparand during a search operation.

22. A method of operating a CAM array, comprising the step of:
   performing a search operation in a staged segment-to-segment manner across a CAM array using a plurality of hybrid comparands that are pipelined into the CAM array during consecutive stages of the search operation, with each of the plurality of hybrid comparands comprising a virtual sector field and a data field.

23. The method of claim 22, wherein said performing step comprises:
   applying a virtual sector field of a first hybrid comparand to a first plurality of data lines that are electrically coupled to a first segment of CAM cells in the CAM array, while concurrently applying a data field of a second hybrid comparand to a second plurality of data lines that are electrically coupled to a second segment of CAM cells in the CAM array.

24. The method of claim 23, wherein said applying step comprises applying the virtual sector field of the first hybrid comparand to the first plurality of data lines while concurrently globally masking a third plurality of data lines that are electrically coupled to a third segment of CAM cells in the CAM array.

25. The method of claim 22, wherein said performing step comprises:
   applying a virtual sector field and a first data field of a first hybrid comparand to a first plurality of data lines that are electrically coupled to a first segment of CAM cells in the CAM array, while concurrently applying a second data field of a second hybrid comparand to a second plurality of data lines that are electrically coupled to a second segment of CAM cells in the CAM array.

26. The method of claim 25, wherein said applying step comprises applying the virtual sector field and the first data field of the first hybrid comparand to the first plurality of data lines while concurrently globally masking a third plurality of data lines that are electrically coupled to a third segment of CAM cells in the CAM array.

27. A method of operating an integrated circuit system, comprising the steps of:
   decoding a first portion of a first input address into sector, sub-sector and virtual sector addresses; and
   performing a search operation in a sector of a CAM device that is designated by the sector address, by applying a first hybrid comparand comprising the virtual sector address and a second portion of the first input address, to first data lines that are electrically coupled to a CAM array within the sector.

28. The method of claim 27, wherein said performing step comprises performing a pipelined search operation in the sector by applying the first search word while concurrently applying a portion of a second hybrid comparand to second data lines that are electrically coupled to the CAM array.

29. An integrated circuit system, comprising:
   a multi-port memory array containing packet header data therein;
   funnel logic that is configured to generate a N-bit comparand comprising portions of at least two header fields read from distinct locations in said multi-port memory array;
   a content addressable memory device that is configured to generate an index in response to application of the N-bit comparand during a search operation; and
   a memory device comprising an entry of microcode therein that is partitioned into at least a first field that identifies a write address in said multi-port memory array to which the index or data derived from using the index as a pointer is to be written.

30. The system of claim 29, wherein said funnel logic comprises:
   a multiplexer that is configured to receive read data from said multi-port memory array; and
   a map table that is configured to pass select signals to said multiplexer, in response to a read address derived from a bit map field within the entry of microcode.

* * * * *